US009112521B2

(12) United States Patent
Dedic et al.

(10) Patent No.: US 9,112,521 B2
(45) Date of Patent: Aug. 18, 2015

(54) MIXED-SIGNAL CIRCUITRY

(71) Applicant: FUJITSU SEMICONDUCTOR LIMITED, Yokohama-shi, Kanagawa (JP)

(72) Inventors: Ian Juso Dedic, Northolt Middlesex (GB); John James Danson, Stittsville (CA)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/473,927

(22) Filed: Aug. 29, 2014

(65) Prior Publication Data

US 2015/0070203 A1    Mar. 12, 2015

(30) Foreign Application Priority Data

Sep. 12, 2013   (EP) .................................... 13184044

(51) Int. Cl.
*H03M 1/10*   (2006.01)
*H03M 1/00*   (2006.01)
(Continued)

(52) U.S. Cl.
CPC .............. *H03M 1/002* (2013.01); *H03M 1/125* (2013.01); *H03M 1/38* (2013.01); *H03M 1/1215* (2013.01); *H03M 1/462* (2013.01)

(58) Field of Classification Search
CPC ....... H03M 1/1215; H03M 1/12; H03M 1/46; H03M 1/38; H03M 1/804; H03M 1/00; H03M 1/0624; H03M 1/462; H03M 1/14; H03M 1/121; H03M 1/1205; H03M 1/50; H03M 1/34

USPC ......... 341/118, 120, 141, 155, 156, 159, 161, 341/172
See application file for complete search history.

(56) References Cited

U.S. PATENT DOCUMENTS 4,763,105 A *  8/1988  Jenq ............................. 341/120
6,384,756 B1 *  5/2002  Tajiri et al. .................... 341/120
(Continued)

FOREIGN PATENT DOCUMENTS

EP   1 202 459 B1   5/2006
EP   1 292 035 B1   10/2006
(Continued)

OTHER PUBLICATIONS

Search Report issued in European Patent Application No. 131840449.9. dated Apr. 4, 2014, 3 pages.
(Continued)

*Primary Examiner* — Linh Nguyen
(74) *Attorney, Agent, or Firm* — Arent Fox LLP

(57) ABSTRACT

Mixed-signal circuitry, comprising: an array of ADC units configured to operate in a time-interleaved manner, and each operable in each of a series of time windows to convert an analog input value into a corresponding digital output value, each conversion comprising a sequence of sub-conversion operations, each successive sub-conversion operation of a sequence being triggered by completion of the preceding sub-conversion operation; and a controller, wherein: at least one of the ADC units is operable to act as a reporting ADC unit and indicate, for each of one or more monitored said conversions, whether or not a particular one of the sub-conversion operations completed during the time window concerned; and the controller is operable to consider at least one such indication and to control the circuitry in dependence upon the or each considered indication.

15 Claims, 14 Drawing Sheets

(51) Int. Cl.
*H03M 1/38* (2006.01)
*H03M 1/12* (2006.01)
*H03M 1/46* (2006.01)

(56) References Cited

U.S. PATENT DOCUMENTS

| | | | |
|---|---|---|---|
| 6,522,282 B1 * | 2/2003 | Elbornsson | 341/155 |
| 6,801,145 B2 * | 10/2004 | Asami | 341/118 |
| 7,049,984 B2 * | 5/2006 | Wood et al. | 341/120 |
| 7,084,793 B2 * | 8/2006 | Elbornsson | 341/118 |
| 7,541,958 B2 * | 6/2009 | Xu | 341/155 |
| 8,957,796 B2 * | 2/2015 | Waltari et al. | 341/118 |
| 2006/0267813 A1 * | 11/2006 | Asami | 341/120 |
| 2010/0085231 A1 * | 4/2010 | Doris | 341/155 |
| 2012/0213531 A1 * | 8/2012 | Nazarathy et al. | 398/202 |
| 2013/0106638 A1 * | 5/2013 | Sutardja et al. | 341/155 |

FOREIGN PATENT DOCUMENTS

| | | |
|---|---|---|
| EP | 2 019 486 A1 | 1/2009 |
| EP | 2 019 490 A1 | 1/2009 |
| EP | 2 009 795 B1 | 6/2010 |
| EP | 2 019 427 B1 | 9/2010 |
| EP | 2 023 487 B1 | 9/2010 |
| EP | 2 023 489 B1 | 2/2011 |
| EP | 2 211 468 B1 | 7/2011 |
| GB | 2 373 654 B | 2/2005 |
| JP | 2 019 487 B1 | 5/2013 |

OTHER PUBLICATIONS

Yang et al., "A 1-GS/s 6-bit 6.7-mW ADC in 65-nm CMOS," IEEE 2009 Custom Integrated Circuits Conference (CICC), 2009, Piscataway, NJ, pp. 287-290.

* cited by examiner

| N (ASYNCH. SAR SUB-CONVERSION OPERATIONS) | AVERAGE DURATION (OF SUB-CONVERSION OPERATION) | $V_{DD}$ | P (POWER) |
|---|---|---|---|
| 8 | 250 ps | 0.8V | 5.12 |
| 7 | 286 ps | 0.75V | 3.94 |
| 6 | 333 ps | 0.7V | 2.94 | e.g. $P \propto V_{DD}^2 \cdot N$

FIG. 10

MIXED-SIGNAL CIRCUITRY

CROSS REFERENCE TO RELATED APPLICATIONS

This application claims priority to European Patent Application No. 13184044.9, filed Sep. 12, 2013, the disclosure of which is hereby incorporated by reference in its entirety.

The present invention relates to mixed-signal circuitry, in particular to ADC (Analogue-to-Digital Converter) circuitry using a successive approximation register (SAR).

Successive-approximation conversion may be considered as one example of a conversion process which is made up of a sequence of sub-conversion operations. ADC circuitry according to the present invention may have particular use, for example, as the ADC circuitry (sub-ADC units) used at the ends of the paths in the sampling circuitry disclosed in EP-A1-2211468.

As background, aspects of the sampling circuitry disclosed in EP-A1-2211468 will be considered.

FIG. 1 is a schematic diagram of analogue-to-digital circuitry 40, to which the invention may be applied. Circuitry 40 comprises sampler 42, voltage-controlled oscillator (VCO) 44 as an example clock-signal generator, demultiplexers 46, ADC banks 48, digital unit 50 and calibration unit 52.

The sampler 42 is configured to perform four-way or four-phase time-interleaving so as to split the input current $I_{IN}$ by current steering into four time-interleaved sample streams A to D. For this purpose, VCO 44 is a quadrature VCO operable to output four clock signals 90° out of phase with one another, for example as four raised cosine signals. VCO 44 may for example be a shared 16 GHz quadrature VCO to enable circuitry 40 to have an overall sample rate of 64 GS/s.

Each of streams A to D comprises a demultiplexer 46 and an ADC bank 48 connected together in series as shown in FIG. 1. The sampler 42 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 64 GS/s, each of the streams A to D may have a 16 GS/s sample rate.

Focusing on stream A by way of example, the stream of current pulses is first demultiplexed by an n-way demultiplexer 46. Demultiplexer 46 is a current-steering demultiplexer and this performs a similar function to sampler 42, splitting stream A into n time-interleaved streams each having a sample rate equal to ¼n of the overall sample rate. Demultiplexer 46 may perform the 1:n demultiplexing in a single stage, or in a series of stages. For example, in the case of n=80, demultiplexer 46 may perform the 1:n demultiplexing by means of a first 1:8 stage followed by a second 1:10 stage.

The n streams output from demultiplexer 46 pass into ADC bank 48, which contains n ADC sub-units each operable to convert its incoming pulse stream into digital signals, for example into 8-bit digital values. Accordingly, n digital streams pass from ADC bank 48 to digital unit 50. In the case of n=80, the conversion rate for the ADC sub-units may be 320 (4×80) times slower than the overall sample rate.

Streams B, C, and D operate analogously to stream A, and accordingly duplicate description is omitted. In the above case of n=80, circuitry 40 may be considered to comprise 320 ADC sub-units split between the four ADC banks 48.

The four sets of n digital streams are thus input to the digital unit 50 which multiplexes those streams to produce a single digital output signal representative of the analogue input signal, current $I_{IN}$. This notion of producing a single digital output may be true schematically, however in a practical implementation it may be preferable to output the digital output signals from the ADC banks in parallel.

Calibration unit 52 is connected to receive a signal or signals from the digital unit 50 and, based on that signal, to determine control signals to be applied to one or more of the sampler 42, VCO 44, demultiplexers 46 and ADC banks 48.

FIG. 2 is a schematic circuit diagram of four-phase (i.e. multiphase) current-mode (current-steering) sampler 42. Although in FIG. 1 a single-ended input signal, current $I_{IN}$, is shown, it will be appreciated that a differential input signal could be employed, for example to take advantage of common-mode interference rejection. Accordingly, the sampler 42 and demultiplexers 46 and ADC banks 48 could be effectively duplicated in circuitry 40 to support such differential signaling, for example requiring 320 differential ADC sub-units, or 640 single-ended ADC sub-units. However, such duplication is omitted from FIG. 1 for simplicity. Returning to FIG. 2, sampler 42 is configured to receive such a differential input current signal, modeled here as a current source $I_{IN}$ whose magnitude varies with the input signal.

Because of the differential signaling, sampler 42 effectively has two matching (or corresponding or complementary) sections 54 and 56 for the two differential inputs. Accordingly, there is a first set of output streams $IOUT_A$ to $IOUT_D$ in section 54 and a second set of matching output streams $IOUTB_A$ to $IOUTB_D$, where IOUTB means $\overline{IOUT}$, and wherein $IOUT_A$ is paired with $IOUTB_A$, $IOUT_B$ is paired with $IOUTB_B$, and so on and so forth.

Focusing on the first section 54 by way of example (because the second section 56 operates analogously to the first section 54), there are provided four n-channel MOSFETs $58_A$ to $58_D$ (i.e. one per stream or path) with their source terminals connected together at a common tail node 60.

The aforementioned current source $I_{IN}$ is connected between common tail node 60 and an equivalent common tail node 66 of section 56. A further current source $I_{DC}$ 62 is connected between the common tail node 60 and ground supply, and carries a constant DC current $I_{DC}$. The gate terminals of the four transistors $58_A$ to $58_D$ are driven by the four clock signals $\theta_0$ to $\theta_3$, respectively, provided from the VCO 54.

As mentioned above, section 56 is structurally similar to section 54 and thus comprises transistors $64_A$ to $64_D$, common tail node 66 and current source $I_{DC}$ 68. Transistors $58_A$ to $58_D$ and $64_A$ to $64_D$ may be referred to as sampler switches SW1 to SW8, respectively.

Operation of the sampler 42 will now be explained, again by way of background and to aid an understanding of the operation of the ADC banks 48 as described later herein.

FIG. 3 shows schematic waveforms for the clock signals $\theta_0$ to $\theta_3$ in the upper graph, and schematic waveforms for three of the corresponding output currents $IOUT_A$ to $IOUT_D$ (current $IOUT_C$ is not shown) in the lower graph.

The clock signals $\theta_0$ to $\theta_3$ are time-interleaved raised cosine waveforms provided as four voltage waveforms from the VCO 44. The use of four clock signals in the present case is due to the four-way-interleaving design of ADC circuitry 40, but it will be appreciated that, in another embodiment, three or more time-interleaved clock signals could be used, for a three-or-more-way split of the input current signal.

Clock signals $\theta_0$ to $\theta_3$ are 90° out of phase with one another, such that $\theta_0$ is at 0° phase, $\theta_1$ is at 90° phase, $\theta_2$ is at 180° phase, and $\theta_3$ is at 270° phase.

The effect of sampling circuitry 42, under control of clock signals $\theta_0$ to $\theta_3$, is that the output currents $IOUT_A$ to $IOUT_D$ are four trains (or streams) of current pulses, the series of pulses in each train having the same period as one of the clock signals $\theta_0$ to $\theta_3$, and the pulses of all four trains together being time-interleaved with one another as an effective overall train of pulses at a quarter of the period of one of the clock signals (or at four times the sampling frequency of one of the clock signals).

For the benefit of further explanation, clock signal $\theta_0$ is highlighted in bold in FIG. 4.

Clock signals $\theta_0$ to $\theta_3$ control the gates of transistors $58_A$ to $58_D$, respectively, in sampler 42. Accordingly, transistors $58_A$ to $58_D$ are turned on and then off in sequence, such that as one of them is turning off the next in sequence is turning on, and such that when one of them is turned fully on the others are substantially turned off.

Because substantially all current entering node 60 via transistors $58_A$ to $58_D$ must exit that node as current $I_{TAIL}$, then the sum of currents $IOUT_A$ to $IOUT_D$ at any time must be substantially equal to $I_{TAIL}=I_{DC}-I_{IN}$. The effect of the gate control mentioned above is therefore that current $I_{TAIL}$ is steered to pass through transistors $58_A$ to $58_D$ in the sequence in which those transistors are turned on and off, i.e. such that as one of them is turning off and thus starts to carry less of $I_{TAIL}$, the next in sequence is turning on and thus starts to carry more of $I_{TAIL}$, and such that when one of them is turned fully on, it carries substantially all of $I_{TAIL}$ because the other transistors are substantially turned off.

This effect is shown in the lower graph of FIG. 3. Only output currents $IOUT_A$, $IOUT_B$ and $IOUT_D$ are shown for simplicity, however the pattern of waveforms shown continues in a similar manner. For comparison with the upper graph of clock signals, the waveform for output current $IOUT_A$ (corresponding to clock signal $\theta_0$) is highlighted in bold.

In order to gain an understanding of the lower graph in FIG. 3, three points, 70, 72 and 74 are indicated on waveform $\theta_0$ and a corresponding three points 80, 82 and 84 are indicated on waveform $IOUT_A$.

At point 70, waveform $\theta_0$ is at its peak value, i.e. at $V_{DD}$, and the other clock signals $\theta_1$ to $\theta_3$ are significantly below their peak value. Accordingly, transistor $58_A$ is fully on and transistors $58_B$ to $58_D$ are substantially off. Therefore, at the corresponding point 80, current $IOUT_A$ is equal to $I_{TAIL}$ and the other currents $IOUT_B$ and $IOUT_D$ (and current $IOUT_C$ not shown) are substantially equal to zero.

At point 72, which precedes point 70, waveform $\theta_0$ is rising towards its peak value but has not yet reached its peak value. Also, at point 72, waveform $\theta_3$ is falling from its peak value. Importantly, at point 72 clock signals $\theta_3$ and $\theta_0$ have equal values. Therefore transistors $58_D$ and $58_A$ are on to the same extent as one another, because their source terminals are connected together. At point 72, clock signals $\theta_1$ and $\theta_2$ are also equal to one another and are sufficiently low to ensure that transistors $58_B$ and $58_C$ are off. Thus, at this point in time, half of current $I_{TAIL}$ flows through transistor $58_D$ and half of it flows through transistor $58_A$, as indicated by point 82, such that $IOUT_D=IOUT_A=(I_{TAIL})/2$.

Point 74 is equivalent to point 72, except that at this point it is transistors $58_A$ and $58_B$ that are both on. Therefore, at corresponding point 84, $IOUT_A=IOUT_B=(I_{TAIL})/2$.

As indicated in FIG. 4, as $i_{TAIL}$ varies, so does the size of the current pulse steered along the various paths. However, the shape of the pulses is still defined by the clock signals as in FIG. 3.

FIG. 5 is a schematic circuit diagram of parts of ADC circuitry 40 useful for understanding the structure and operation of the demultiplexers 46, which lead towards the ADC banks 48.

For simplicity, only part of the sampler circuitry 42 is shown. That is, only the "plus" section 54 is shown, and elements of that "plus" section 54 are omitted to avoid over-complicating FIG. 5.

Regarding the demultiplexers 46, only the demultiplexing circuitry 46 for output $IOUT_A$ is shown. Similar circuitry may also be provided for the other seven outputs $IOUT_B$ to $IOUT_D$, and $IOUTB_A$ to $IOUTB_D$.

As shown in FIG. 5, demultiplexers 46 in the present embodiment are formed of two stages, namely stages 46A and 46B. The first stage 46A performs 1:N demultiplexing, and the second stage 46B performs 1:M demultiplexing.

Stages 46A and 46B generally have the same structure as the array of sampling switches 110 of the sampling circuitry 42. That is, each stage comprises a plurality of transistors (in this case, n-channel MOSFETs) whose source terminals are connected together at a common tail node.

From the above description of sampling circuitry 42, and considering only the "plus" section 54 by way of example, it will be appreciated that the circuitry splits the input current $I_{IN}$ (or $I_{TAIL}$) into X time-interleaved trains of pulses, where X=4 in the present embodiment. In the present embodiment, those pulse trains are provided at outputs $IOUT_A$ to $IOUT_D$. Sampling circuitry 42 can thus be thought of as performing a 1:X demultiplexing function. In the same way, each output from sampler 42 can be further 1:N demultiplexed by a stage 46A, and each output of a stage 46A can be further 1:M demultiplexed by a stage 46B.

Only one complete demultiplexed path is shown in FIG. 5. That is, input current $I_{IN}$ is demultiplexed to provide X (X=4 in the present case) outputs $IOUT_A$ to $IOUT_D$. Each of those outputs is then 1:N demultiplexed by a stage 46A, however this is only shown in FIG. 5 in respect of the left-most output $IOUT_A$. Consequently, the outputs from that shown stage 46A are outputs $IOUT_{A10}$ to $IOUT_{A1(N-1)}$. Each of those outputs (for all stages 46A) is then 1:M demultiplexed by a stage 46B, however this is again only shown in FIG. 17 in respect of the left-most output $IOUT_{A10}$. Consequently, the outputs from that shown stage 46B are outputs $IOUT_{A1020}$ to $IOUT_{A102(M-1)}$. Corresponding outputs are produced by the other stages 46B.

The sampling circuitry 42 and demultiplexers 46 together carry out a 1:Z demultiplexing function, where Z=X×N×M. In the present example, X=4, N=8 and M=10. Thus, the present example performs 1:320 demultiplexing (in line with the earlier description above), which leads to 320 outputs on the "plus" side 54 and a corresponding 320 outputs on the "minus" side 56.

Looking back to FIG. 1, the output signals from demultiplexers 46 pass into ADC banks 48. ADC banks 48 are used to produce digital values corresponding to the areas of the respective current pulses input thereto.

FIG. 6 is a schematic diagram useful for understanding the principle of operation of ADC banks 48. For simplicity, only one output, $IOUT_{A1020}$, of demultiplexers 46 is shown, and consequently the ADC circuitry 48 shown represents only the ADC circuitry (ADC unit) required for that particular output. Similar ADC circuitry 48 may be provided for all the outputs of the demultiplexers 46.

ADC circuitry 48 generally takes the form of a capacitance 150. As shown in FIG. 6, capacitance 150 may be variable in value, such that its value can be trimmed during calibration or during an initial setup phase. Generally speaking, capacitance 150 is employed to convert the current pulses from output $IOUT_{A1020}$ into voltage values $V_{OUT}$. That is, each pulse charges up capacitance 150 to a voltage proportional to the area of the pulse concerned. This is because the amount of charge in each current pulse is defined by its area (Q=∫I dt), and because the voltage across the capacitance 150 is defined by that amount of charge Q and the capacitance value C (V=Q/C).

The voltage $V_{OUT}$ for a particular pulse is held across capacitance 150 until the circuitry 48 is reset by reset switch 152. Whilst the voltage $V_{OUT}$ for a particular pulse is held, this analog output value can be converted into a digital output value, for example using an ADC circuit employing a successive-approximation register (SAR). In the case of differential circuitry, as in the present embodiment, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 154 and 156 of the same current pulse are shown in FIG. 6. The first pulse 154 represents a case in which minimal delay is experienced. The second pulse 156 represents a case in which some delay/spreading is experienced, for example due to track capacitance in the circuitry. Consequently, pulse 156 is stretched in time as compared to pulse 154. Importantly, the area of the two pulses 154 and 156 is substantially the same, and thus the output voltage $V_{OUT}$ would be the same for both.

FIG. 7 is a schematic diagram useful for understanding a possible application of SAR-ADC (Successive Approximation Register-Analogue-to-Digital Conversion) circuitry within each sub-ADC unit of the circuitry 48 in FIG. 6. Such circuitry could have a cycle of sub-conversion operations (phases/steps) of the form: Reset (R); Sample (S); 1; 2; 3; 4; 5; 6; 7 and 8, as shown in FIG. 7. In each Sample sub-conversion operation, a current pulse concerned may be converted into an output voltage $V_{OUT}$, and subsequently that voltage $V_{OUT}$ may be turned into an 8-bit digital value over the following 8 SAR sub-conversion operations. The next Reset sub-conversion operation then prepares the circuitry for the next current pulse.

For a fuller understanding of the ADC circuitry disclosed in EP-A1-2211468, reference may be made to FIGS. 9, 10, 12, 13, 17, 19 and 20 thereof which correspond respectively to the present FIGS. 1 to 7.

FIG. 8 presents example SAR ADC circuitry which may be employed with the circuitry of FIGS. 1 and 6, i.e. as part of the sub-ADC units of the ADC banks 48. The main elements are a S/H circuit 170 to acquire $V_{OUT}$ from FIG. 6, a voltage comparator 180, an internal DAC 190 and an SAR 200. The comparator 180 compares the held $V_{OUT}$ with the output of the internal DAC 190 and outputs the result of the comparison to the SAR 200. The SAR 200 is designed to supply a digital code approximating $V_{OUT}$ to the internal DAC 190. The DAC 190 supplies the comparator with an analogue voltage based upon the digital code input from the SAR 200.

The SAR 200 is initialised so that its MSB is equal to digital 1 (the other bits being digital 0). This code is then input to DAC 190, whose output analogue voltage is supplied to comparator 180. If this analogue voltage is greater than $V_{OUT}$ the comparator 180 causes SAR 200 to reset this bit; otherwise, the bit is kept as a 1. Then, the next bit is set to 1 and the same procedure (sub-conversion operation) is followed, continuing this binary search until every bit in the SAR 200 has been tested (these "tests" corresponding respectively to sub-conversion operations 1 to 8 in FIG. 7). The resulting digital code output from the SAR 200 is the digital approximation of the sample voltage $V_{OUT}$ and is finally output when the conversion is complete.

Typically, as indicated in FIG. 9A, such SAR ADC circuitry is operated in a synchronous mode. That is to say, the phases, steps or sub-conversion operations (R; S; 1; 2; 3; 4; 5; 6; 7; 8) start and finish synchronously with respect to a clock signal. However, this may lead to problems in certain steps dependent on the analogue input $V_{IN}$. For example, each of steps (sub-conversion operations) 1 to 8 may comprise its own sub-processes in which the output of DAC 190 settles, the comparator 180 resets and the comparator 180 makes its decision. As indicated in FIG. 9A, in some cases one of the sub-conversion operations (e.g. number 5) might generate an erroneous result for example because the comparator input voltage was very small (e.g. much less than 1 LSB) and so there was not enough time in that step for its sub-processes to all complete satisfactorily. This can generally only happen in one conversion step (sub-conversion operation) per conversion, since the input voltage could only be very close to one of the possible digital values. Thus, for all the other sub-conversion operations the voltage difference must be at least 1 LSB, so those other sub-conversion operations (steps) may have too much time available to perform their sub-processes.

Clearly, the more significant the sub-conversion operation which produces an error, the larger the error in the end result (digital code) of the ADC circuitry. However, if the supply voltage is set high enough that all devices have enough time to complete over all conditions, most devices will have higher voltage than needed which wastes power.

It is desirable to solve one or more of the above problems.

Aspects of the present invention are defined by the appended independent claims. Specific embodiments are defined by the dependent claims.

According to a first aspect of the present invention, there is provided mixed-signal circuitry, comprising: an array of ADC units configured to operate in a time-interleaved manner, and each operable in each of a series of time windows to convert an analogue input value into a corresponding digital output value, each conversion comprising a sequence of (asynchronous) sub-conversion operations, each successive sub-conversion operation of a sequence being triggered by completion of the preceding sub-conversion operation; and a controller, wherein: at least one of the ADC units is operable to act as a reporting ADC unit and to indicate, for each of one or more monitored said conversions, whether or not a particular one of the sub-conversion operations completed (at least to a given extent) during the time window concerned; and the controller is operable to consider at least one such indication and to control the circuitry in dependence upon the or each considered indication.

The controller may be operable to control the circuitry to bring a value of power consumption and/or of speed of operation and/or of accuracy of conversion towards or to a desired value. This may be done on a per-ADC unit basis or per group of ADC units. The controller may balance desires for low power-consumption, high speed of operation and high conversion-accuracy. The controller may be configurable or configured to achieve a particular or given desired such balance.

Such circuitry is considered advantageous, since it is possible to control its operation in accordance with its operational performance, for example to bring its operational performance towards a desired performance. Such control may have a focus on power consumption of the circuitry, and enable the performance to be controlled to bring a current power consumption towards a desired consumption, for example to below a threshold consumption. Such control may have a focus on conversion accuracy, and enable the performance to be controlled to bring a current conversion accuracy towards a desired accuracy. Combinations of such factors may be taken into account, for example to balance different requirements and enable an acceptable power consumption and conversion accuracy to be achieved.

Such mixed-signal circuitry may be for use in an integrated circuit, and may handle signals of different types, i.e. digital and analogue signals. Such circuitry may be part or all of an analogue-to-digital converter. The array of ADC units may be arranged in an order, and for example organised into sub-groups or sub-arrays. The time-interleaved operation may allow the ADC units to operate in a parallel but time-staggered manner, for example with the operations of each successive ADC unit of the array being delayed by one or more clock cycles of a system clock signal relative to those of the preceding ADC unit of the array. The series of time windows for each ADC unit may be continuous, in the sense that each successive window of the series starts immediately when the preceding window ends, although it is also possible for there to be gaps between successive windows. The series of time windows for each successive ADC unit of the array may be delayed relative to those of the preceding ADC unit of the array. The time windows may all have the same length. Each analogue value may be a voltage magnitude or an amount of charge in a received packet of charge. The output digital values may all have the same format, for example they may all be 4, 6, 8, or 16 bit values (or be composed of any other integer number of bit values).

Each successive sub-conversion operation of a sequence may be triggered by completion of the preceding sub-conversion operation, such that those sub-conversion operations proceed one after the other in an asynchronous manner, i.e. independently of a system clock signal which may trigger the first sub-conversion operation (or first few sub-operations) of the sequence, and or define the time windows. The time windows may be synchronous with such a clock signal.

An ADC unit may be a reporting ADC unit in the sense that it outputs a signal which is indicative of whether or not a particular one of the sub-conversion operations completed during the time window concerned. Such an output signal may have one value if a particular one of the sub-conversion operations completed during the time window concerned and another value if it did not. A sub-conversion operation may be considered to be completed if it has finished successfully (at least to a given extent), for example if all component operations of the sub-conversion operation finished successfully. For example, the mixed-circuitry may be configured to reset each ADC unit at the end of each of its time windows, such that any sub-conversion operations not yet finished successfully finish unsuccessfully.

The controller may consider indications in the sense of factoring them into control processing or decision making, for example into judging whether the operational performance of the mixed-signal circuitry (in particular, the array of ADC units) meets a target performance. The controller may consider indications in the sense of analysing them or taking them into account when performing such control.

The time windows may all be of the same length, i.e. for all ADC units and for all conversions, optionally determined by a clock signal common to the array. This may simplify control of the circuitry as a whole.

The time windows for the ADC units may be synchronised with one another. The series of time windows for the respective ADC units may be time-interleaved, i.e. so that they overlap in time to an extent and are operated thus at least partially in parallel.

The ADC units of the array may be organised into an order, corresponding to their time-interleaved operation. The series of time windows for the respective ADC units may thus be shifted or offset in time one series to the next in the order in accordance with the time-interleaved operation.

Some or all of the ADC units may act as reporting ADC units. The controller may be operable to configure which ADC units act as reporting ADC units, optionally on a dynamic basis. For example, an ADC unit may act as a reporting ADC unit only some of the time. The controller may for example select which ADC units are reporting units on an ongoing basis, e.g. identifying parts of the array which require monitoring and selecting ADC units from those parts to be reporting ADC units. Optionally, all of the ADC units may act as reporting ADC units at the same time, i.e. for normal operation of the mixed-signal circuitry.

Some or all of the conversions may be monitored conversions. For example, a reporting ADC unit may monitor and report on all of its conversions or only some of them. The controller may be operable to configure which conversions are monitored conversions, optionally on a dynamic basis.

Some or all of the indications may be considered indications. For example, the controller may take into account some or all of the indications it receives when controlling operation of the mixed-signal circuitry. The controller may consider received indications in groups, or as received over given time or operational periods. For example, the controller may consider the indications received over a period of time during which the ADC units of the array each carry out the same number of conversions. The controller may be operable to configure which indications are considered indications, optionally on a dynamic basis.

The controller may be operable to consider a set of indications provided during a particular time period, and to perform the control based on the set of considered indications. Such a set may comprise the indications of a given number of conversions (e.g. consecutive conversions) for each reporting ADC unit. The particular time period may comprise an array of time-interleaved time windows, the array of time-interleaved time windows comprising a given number of time windows per ADC unit of the array of ADC units. The given number may be any positive integer.

The controller may be operable to consider a set of indications provided by a group of the ADC units, and to perform the control based on the set of considered indications. The group of ADC units may be a subset or sub-array of the array of ADC units. For example, if the ADC units are arranged in plural rows or columns, a row or column (e.g. bank) may constitute such a group.

The controller may be operable to carry out the consideration and control at least or only during control periods. That is, the controller need not carry out its control all of the time, and may stop such control to save power/control burden. For example, the controller may carry out its control for less than 10% or even 1% of the time. The controller may be operable to configure when the control periods occur, for example carrying out control more often or for longer when the performance of the circuitry is further away, or is tending to drift faster away, from a target performance.

The controller may be operable to configure which sub-conversion operation per sequence of sub-conversion operations is the particular one. For example, the controller may configure the penultimate sub-conversion operation per sequence to be the final one, so that control of the circuitry may ensure or increase the chances of at least the sub-conversion operations other than the final one per sequence completing. The circuitry may be configured such that the final or penultimate (or any earlier) sub-conversion operation per sequence is the particular one.

The controller may be operable to configure how many sub-conversion operations there are in the sequences, for example relative to the number of bits desired in the digital output values. For example, if the final sub-conversion operation per sequence is the particular one, the controller may configure the sequences such that there is one (or another number) more sub-conversion operation than needed to create the digital output values concerned. Control of the circuitry may then ensure or increase the chances of at least the sub-conversion operations necessary to create the digital output values concerned completing.

The reporting ADC units may be operable to perform such indication by outputting a conversion-complete signal when the particular one of the sub-conversion operations of a monitored conversion completes during the time window concerned. Such a signal may be a digital or analogue signal. The controller may be connected to receive such signals, or to receive a signal which is a mathematical combination (e.g. sum) or logical combination (e.g. AND, NAND, OR, NOR) of such signals.

The reporting ADC units may be operable to perform such indication by outputting said digital output values, the controller being operable to control the circuitry by analysing some or all of such digital output values. For example, the controller may be operable to perform frequency-domain analysis of the digital output values concerned. The controller may be operable to perform SNR (Signal-to-Noise Ratio) analysis of the digital output values concerned.

The controller may be operable to control the circuitry by controlling the magnitude of a supply voltage provided individually to one or more ADC units of the array, and/or in common to some or all of the ADC units of the array. Such control may comprise increasing, decreasing or maintaining the supply voltage concerned. For example, the supply voltage may be increased to increase the speed of operation of the ADC units concerned, or decreased to decrease the speed of operation of the ADC units concerned and save power.

The controller may be operable to control the circuitry by controlling the magnitude of a bulk voltage supplied to field-effect transistors of one or more ADC units of the array. Such control may comprise increasing, decreasing or maintaining the bulk voltage concerned. For example, the bulk voltage (e.g. bulk-source voltage) may be decreased to increase the speed of operation of the ADC units concerned, or increased to decrease the speed of operation of the ADC units concerned. This may be an appropriate control for NMOS bulk voltages, with the reverse case being so for PMOS bulk voltages. NMOS bulk voltages may be adjusted such that increasing the bulk-source voltage decreases speed, and decreasing the bulk-source voltage increases speed.

One possibility is to reduce power (e.g. leakage current) solely or at least by adjusting bulk voltage. For example, the supply voltage may remain fixed while the bulk voltage is adjusted to decrease the speed of operation and save power. If the bulk-source voltage is decreased to increase the speed of operation, it may be possible to decrease the supply voltage (effectively countering that increase in speed to a degree) and save power.

The controller may be operable to control the circuitry based on the considered indications to tend to cause future such indications to indicate that a target performance has been achieved. That is, such control may be carried out on an ongoing basis (e.g. control loop with feedback), using current indications to control future operation.

The target performance may comprise a target amount of power consumed by one or more ADC units of the array, and/or a target proportion of the considered indications which indicate that the particular sub-conversion operation completed in the time window concerned. For example, the controller may be operable to reduce supply voltage to save power as far as possible while still ensuring that a sufficient number of the reporting ADC units issue indications sufficiently consistently or often. For example, the controller may be operable to reduce supply voltage to save power as far as possible while still ensuring that all of ADC units complete their conversions sufficiently consistently or often. Threshold values may be used to decide whether indications are issued sufficiently consistently or often.

The controller may be operable to perform its control in respect of at least the ADC units from which the considered indications were provided. For example, the controller may perform its control in respect of all of the ADC units even if only some of them are reporting ADC units. The controller may perform its control in respect of (e.g. only) non-reporting ADC units.

The controller may be operable to configure whether the final sub-conversion operations per sequence contribute to the respective digital output values. For example, if 8-bit digital values are desired, requiring 8 sub-conversion operations per sequence, the sequences may nevertheless have 9 sub-conversion operations. The controller may in such a case configure the ADC units such that the final sub-conversion operation per sequence does not contribute to the respective digital output values. The mixed-signal circuitry may be configured such that the final sub-conversion operation per sequence does not contribute to the respective digital output values.

Some or all of the sub-conversion operations in a sequence may generate a corresponding bit value of the digital output value concerned. The sub-conversion operations may be successive-approximation operations. The or each ADC unit may be an asynchronous ADC unit. The array of ADC units may comprise at least 8, 16, 32, 64 or 128 ADC units.

According to a second aspect of the present invention, there is provided mixed-signal circuitry, comprising: an (optionally asynchronous) ADC unit, operable in each of a series of time windows to convert an input analogue value into an n-bit digital value, each conversion comprising a sequence of n sub-conversion processes, where each successive process in the sequence is triggered by the preceding process, and operable to output a conversion-complete signal each time a given one of the processes in the sequence completes during the time window concerned; and a controller connected to receive the conversion-complete signals and operable to control operation of the circuitry in dependence upon the received conversion-complete signals.

The controller may be operable to control operation of the circuitry in dependence upon whether a conversion-complete signal is received for each said time window. The circuitry may comprise a plurality of such ADC units, wherein the controller is connected to receive the conversion-complete signals from the plurality of ADC units. The controller may be operable to control operation of the circuitry in dependence upon whether a conversion-complete signal is received for each said time window for (each) ADC unit.

According to a third aspect of the present invention, there is provided mixed-signal circuitry, comprising: an ADC unit operable in each of a series of time windows to convert an analogue input value into a corresponding digital output value, each conversion comprising a sequence of sub-conversion operations, each successive sub-conversion operation being triggered by completion of the preceding sub-conversion operation; and a controller, wherein: the ADC unit is operable to indicate, for each of one or more observed said conversions, whether or not a particular one of the sub-conversion processes completed during the time window concerned; and the controller is operable to control the circuitry in dependence upon such indication.

According to a fourth aspect of the present invention, there is provided mixed-signal circuitry, comprising: a plurality of ADC units each operable to convert analogue input values into respective digital output values, each conversion comprising a sequence of successive approximation operations (each such operation generating a corresponding bit value of the digital output value concerned); and a control unit; wherein: at least one ADC unit is operable to output a completion signal when a given number of said successive approximation operations of a conversion have been completed; and the control unit is operable to control the system in dependence upon at least one said completion signal.

According to a fifth aspect of the present invention, there is provided mixed-signal circuitry, comprising: an ADC unit operable to convert analogue input values into respective digital output values, each conversion comprising a sequence of successive approximation sub-conversion operations, each sub-conversion operation generating a corresponding bit value of the digital output value concerned; and a control unit; wherein: the ADC unit is operable to indicate its performance for each conversion; and the control unit is operable to control the circuitry in dependence upon said indications.

The ADC unit may be a synchronous ADC unit whose operations are synchronised with a clock signal, and the ADC unit may be operable to indicate, for each conversion, whether or not the sub-conversion operations completed fully; and the control unit may be operable to control the circuitry in dependence upon said indications. More preferably, the ADC unit may be an asynchronous ADC unit whose operations are synchronised with a clock signal, only in that a first one or more of them are so synchronised. Subsequent such operations may be triggered one from the next independently of the clock signal.

According to a sixth aspect of the present invention, there is provided an analogue-to-digital converter comprising mixed-signal circuitry according to any of the aforementioned mixed-signal circuitry aspects of the present invention.

According to a seventh aspect of the present invention, there is provided an integrated circuit or an IC chip comprising mixed-signal circuitry according to any of the aforementioned mixed-signal circuitry aspects of the present invention, or an analogue-to-digital converter according the aforementioned sixth aspect of the present invention.

Further aspects of the present invention comprise method aspects (methods of controlling mixed-signal circuitry) corresponding in scope respectively with the aforementioned mixed-signal circuitry aspects of the present invention. Optional features relating to the aforementioned apparatus (circuitry) aspects apply equally to the method aspects.

Reference will now be made, by way of example, to the accompanying drawings, of which:

FIG. 1, as mentioned above, is a schematic diagram of analogue-to-digital circuitry, to which the invention may be applied;

FIG. 2, as mentioned above, is a schematic circuit diagram of the four-phase current-mode sampler of FIG. 1;

FIG. 3, as mentioned above, shows schematic waveforms for the clock signals $\theta_0$ to $\theta_3$ of FIG. 2, and schematic waveforms for three of the corresponding output currents $IOUT_A$ to $IOUT_D$;

FIG. 4, as mentioned above, shows schematic waveforms indicating how output currents $IOUT_A$ to $IOUT_D$ may vary with varying $i_{TAIL}$;

FIG. 5, as mentioned above, is a schematic circuit diagram of parts of the FIG. 1 circuitry useful for understanding the structure and operation of its demultiplexers;

FIG. 6, as mentioned above, is a schematic diagram useful for understanding the principle of operation of ADC units of the FIG. 1 ADC banks;

FIG. 7, as mentioned above, is a schematic diagram useful for understanding a possible application of SAR-ADC circuitry within each sub-ADC unit of FIG. 6;

FIG. 8, as mentioned above, is a schematic diagram of example SAR ADC circuitry which may be employed with the circuitry of FIGS. 1 and 6, as part of the sub-ADC units;

FIG. 9A, as mentioned above, is a schematic diagram relating to the synchronous mode of operation of the FIG. 8 SAR ADC circuitry;

FIG. 10 is a table indicating how reducing ADC resolution (8 b to 6 b) increases the amount of time available per sub-conversion operation and may thus allow for a reduction in $V_{DD}$ and power consumption;

Figure 9A:
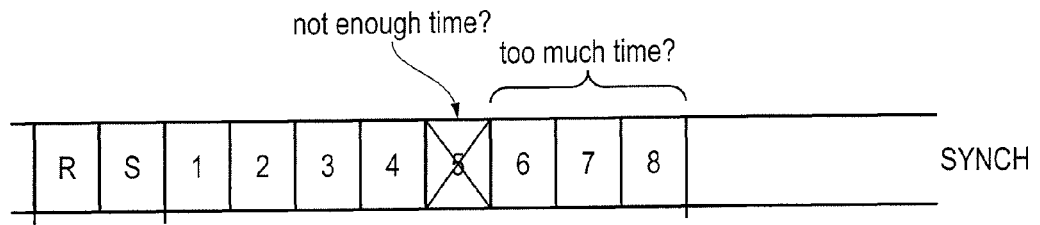
FIG. 9B is a schematic diagram useful for understanding an asynchronous mode of operation.
FIG. 9C is a schematic diagram of example SAR ADC circuitry configured to operate in asynchronous mode.

One possible way to address issues with the FIG. 9A methodology is to operate the ADC circuitry in an asynchronous mode, where sub-conversion operations (steps) 1 to 8 are performed one after the next but only moving on when the preceding operation is finished. The overall conversion process is thus made up of sequential sub-operations and independently timed for each overall conversion and each sub-operation (other than, e.g. Reset and Sample). This has the advantage that each sub-conversion operation which completes should complete without error, but has the disadvantage that the point at which the overall conversion completes is variable.

Figure 9B:
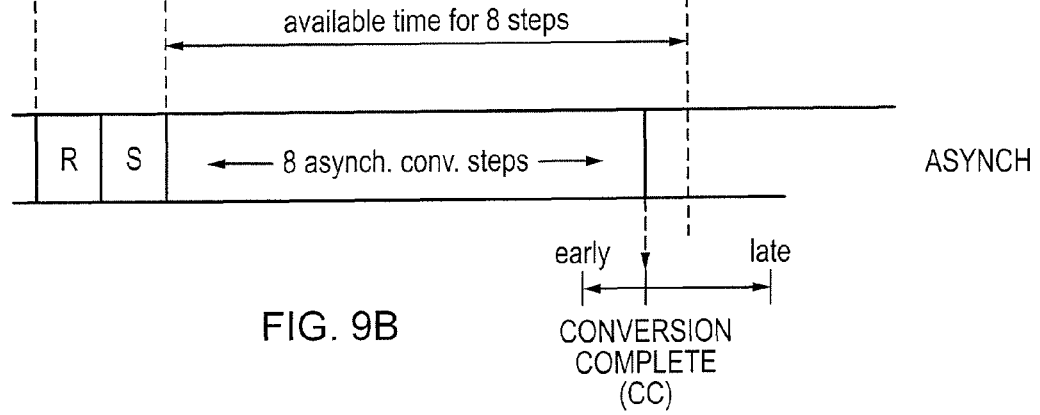

For example, as indicated in FIG. 9B, the ADC circuitry may be configured to issue a Conversion Complete (CC) signal when each sub-conversion operation is complete, or only when a particular sub-conversion operation such as the final sub-conversion operation is complete. Moreover, the final Conversion Complete (CC) signal may be received within the available time for 8 sub-conversion operations (as in FIG. 9A), or not (i.e. at all). In fact, the overall result is typically faster than synchronous conversion because most asynchronous conversions are faster (no wasted time), and there can generally only be one "slow" cycle in a binary search because each DAC code can only be used once, and only one code can be very close to the input voltage. However, if the supply voltage is set high enough that all devices have enough time to complete over all conditions, most devices will have higher voltage than needed which wastes power.

Figure 8:
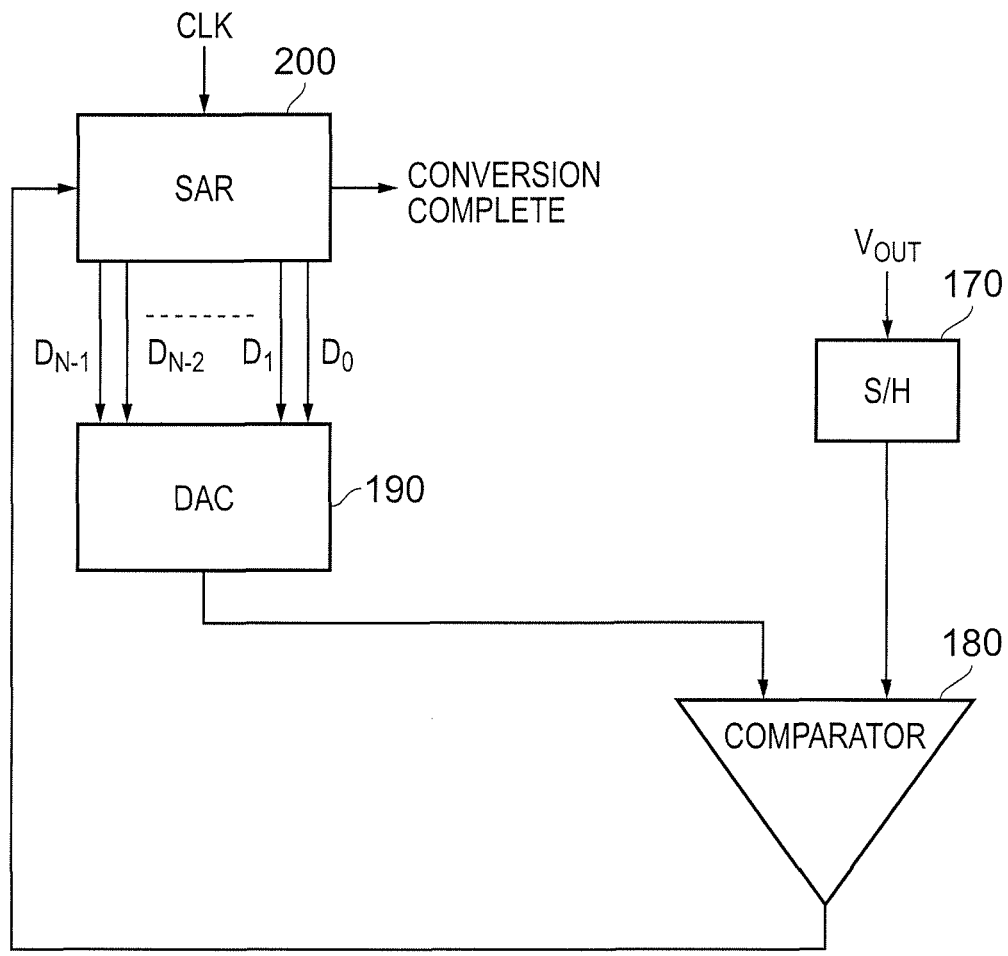
Figure 9C:
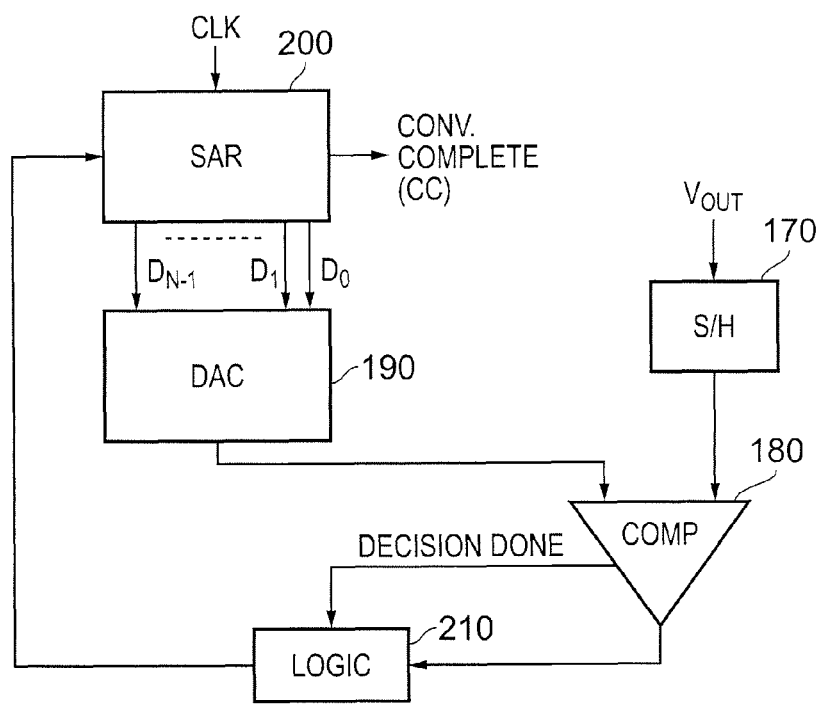

FIG. 9C presents circuitry corresponding to that in FIG. 8, adapted to operate in asynchronous mode in line with FIG. 9C. The main difference is that a "decision done" is output by comparator 180 to logic 210 to determine when the next sub-conversion operation (step) may be carried out. Logic 210 may of course control other elements of the circuitry. Moreover, a Conversion Complete (CC) signal is issued or provided when the final sub-conversion operation is complete.

Figure 7:
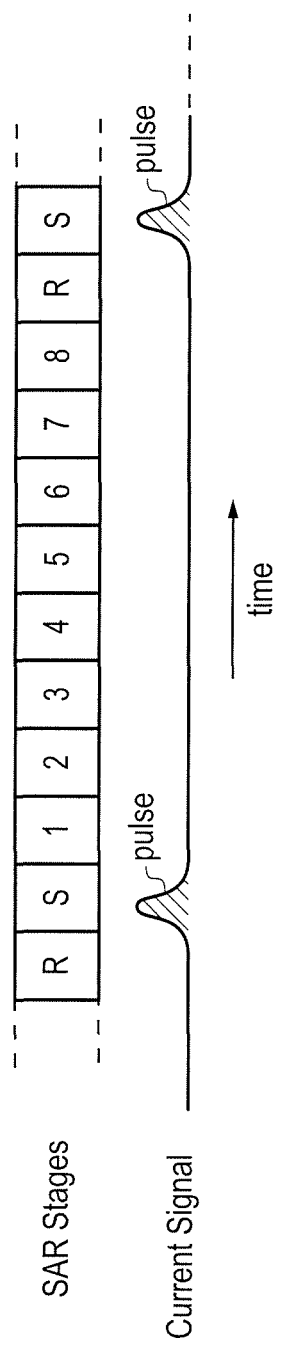

Against this backdrop, and by way of introduction, the techniques employed by the present invention may be summarised as follows (given use of the asynchronous mode mentioned above). These techniques are described with the circuitry of FIGS. 1 to 8 in mind, by way of example only, where there would be an array of sub-ADC units (as in ADC banks 48) operating in a time-interleaved manner based on the time interleaved pulses (see e.g. FIG. 7) received from upstream in the circuitry. For simplicity, such sub-ADC units or circuits will be referred to herein simply as ADC units, each operating in the asynchronous mode as in FIG. 9C. Moreover, reference numerals used in FIG. 1 will be reused in the following explanation for ease of understanding.

Figure 1:
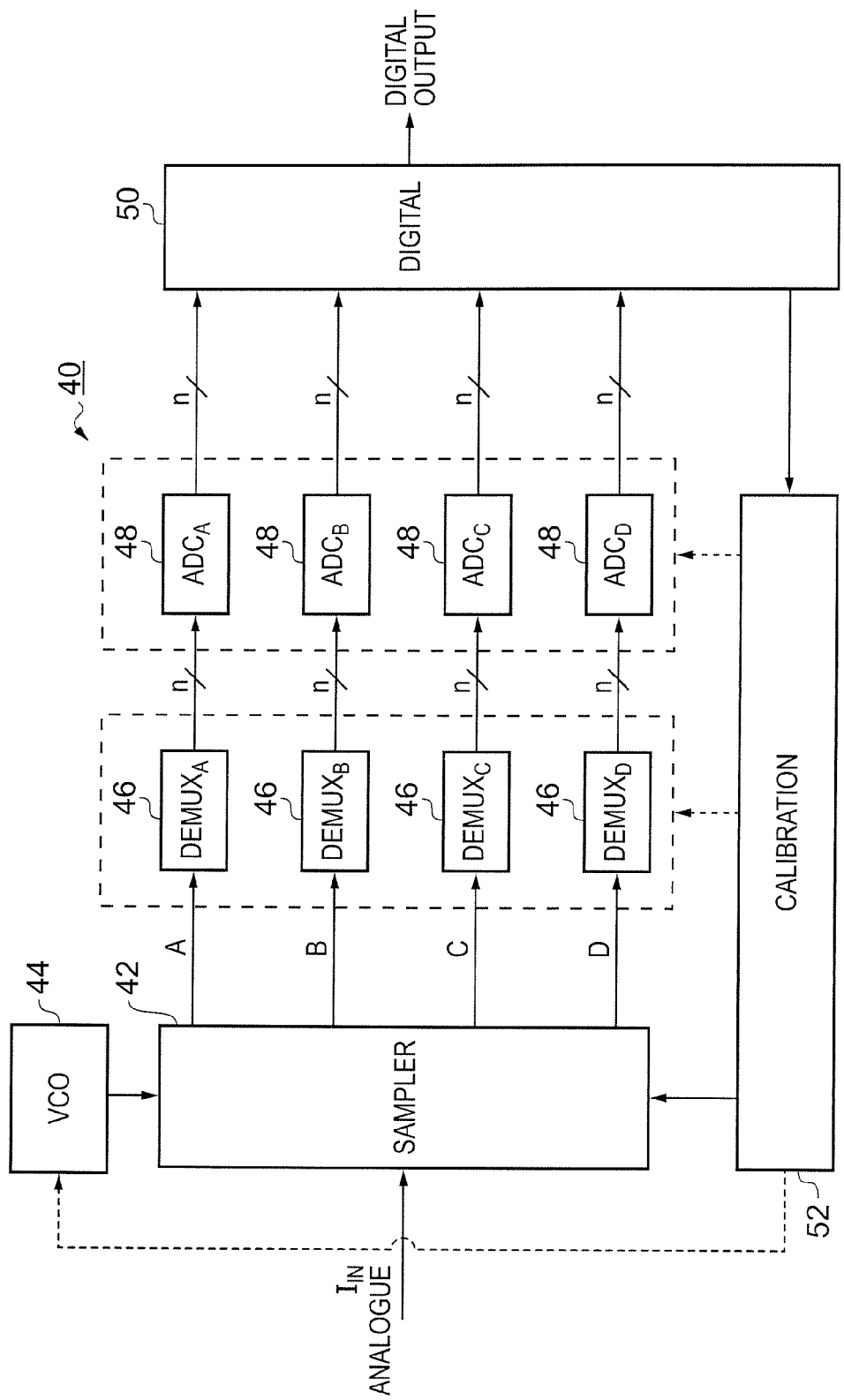
Figure 2:
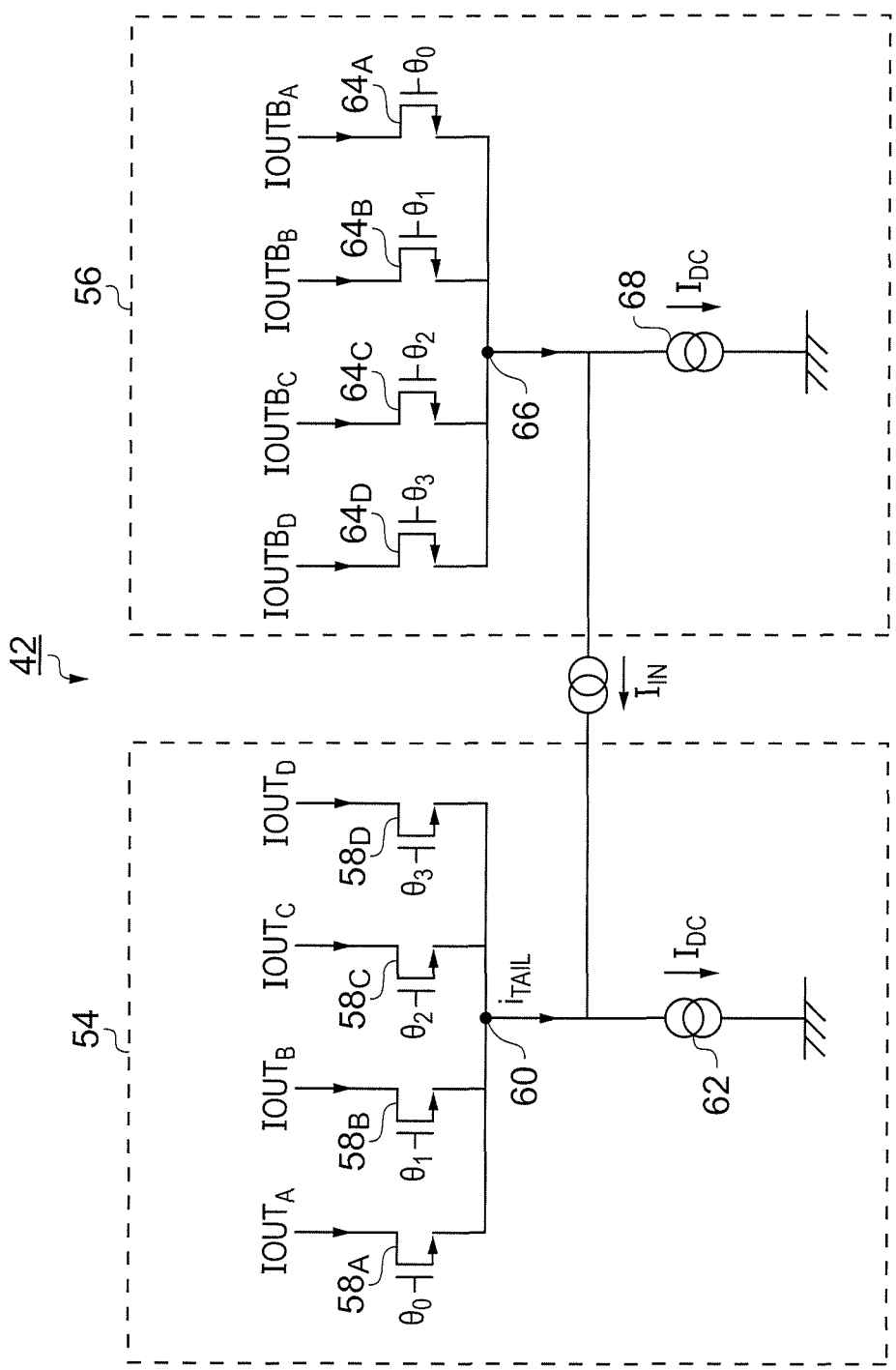
Figure 3:
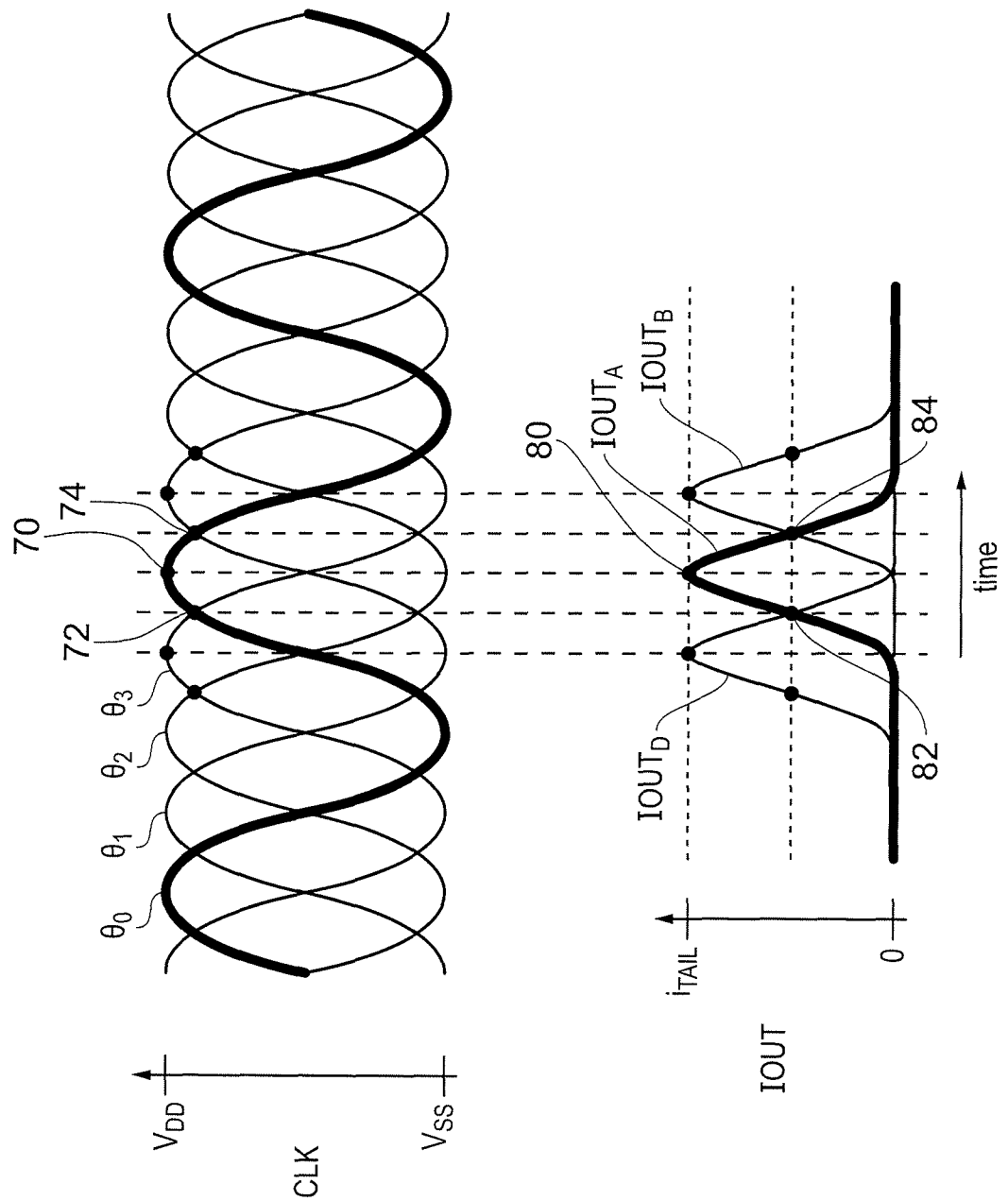
Figure 4:
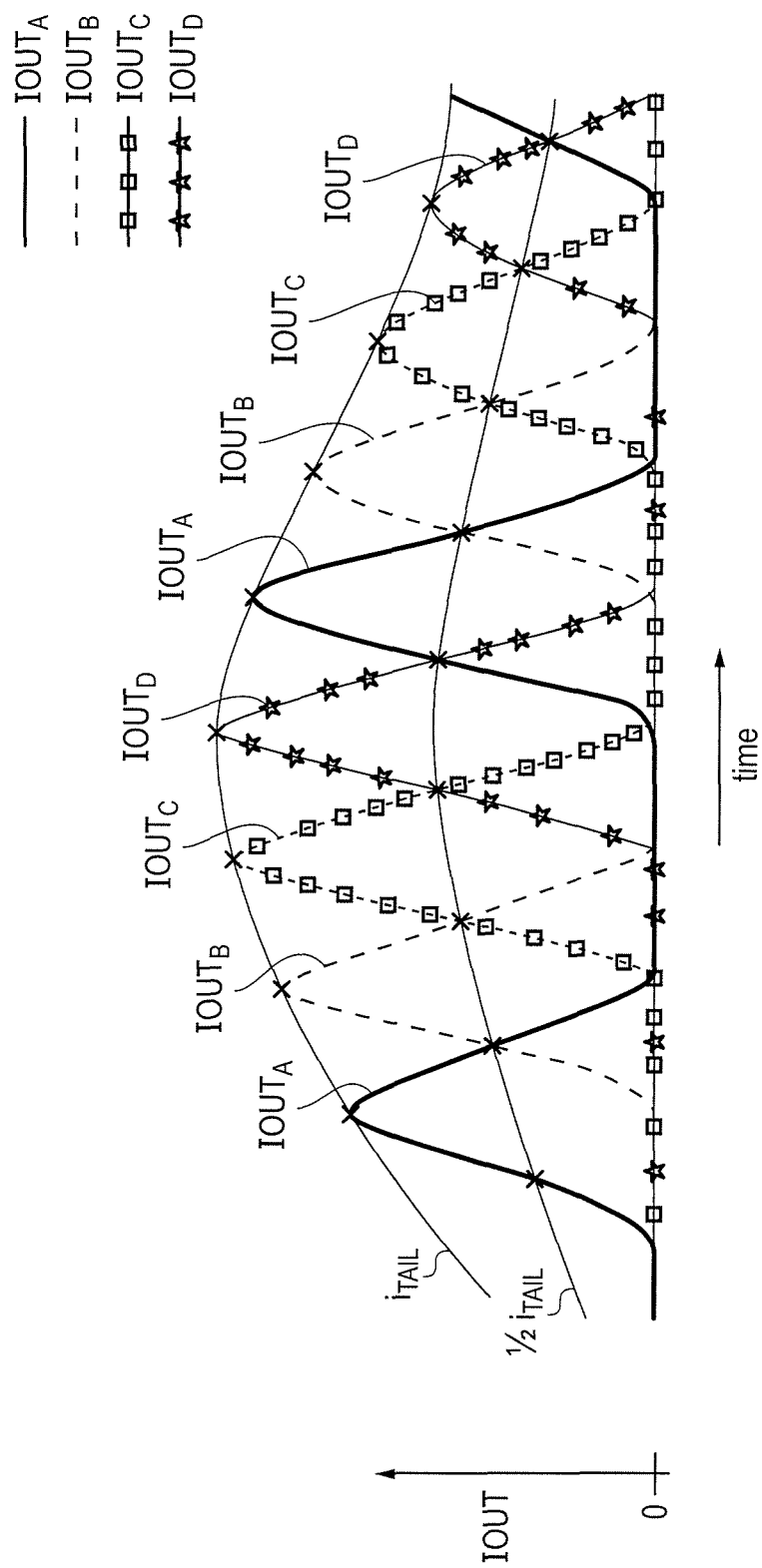
Figure 5:
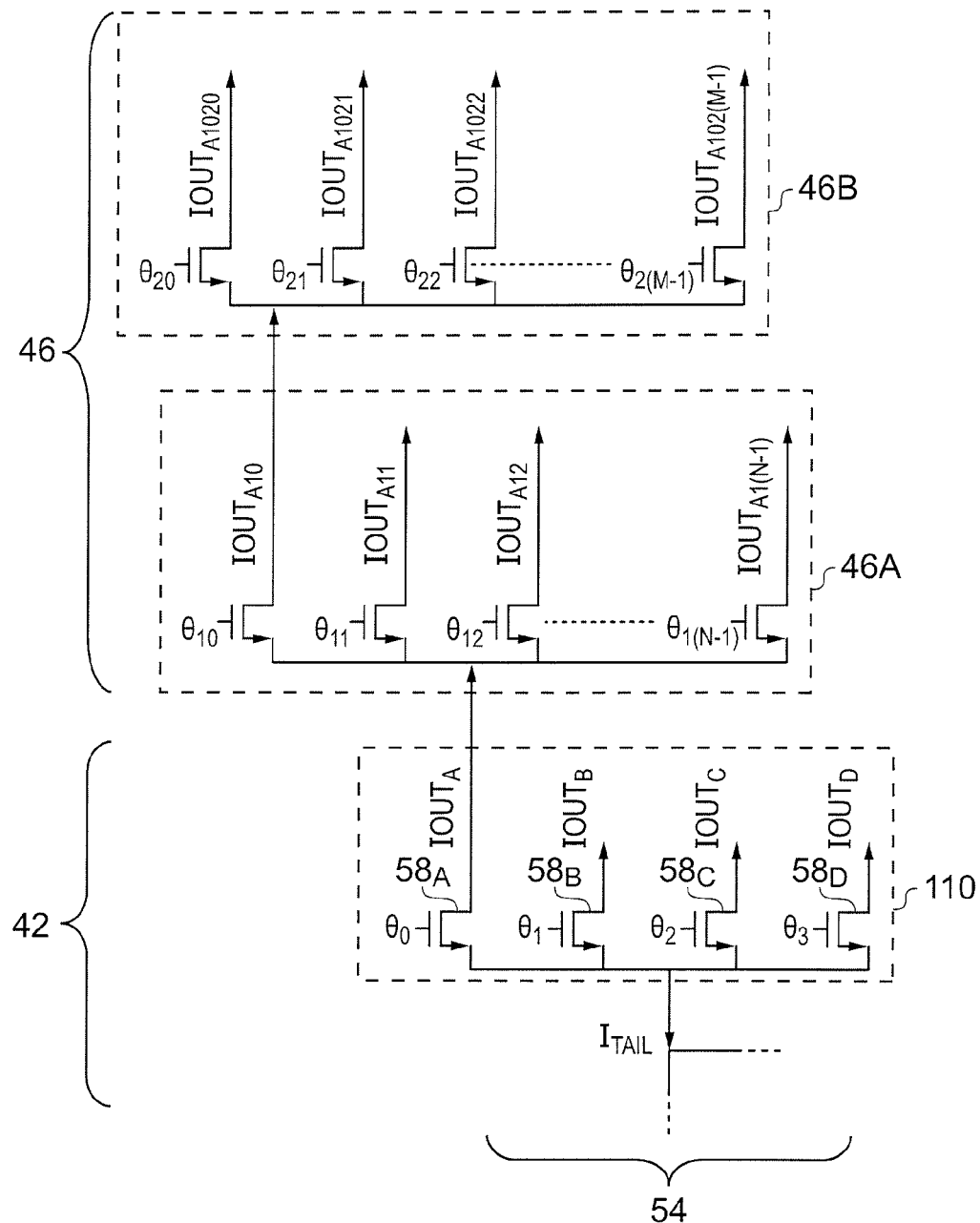
Figure 6:
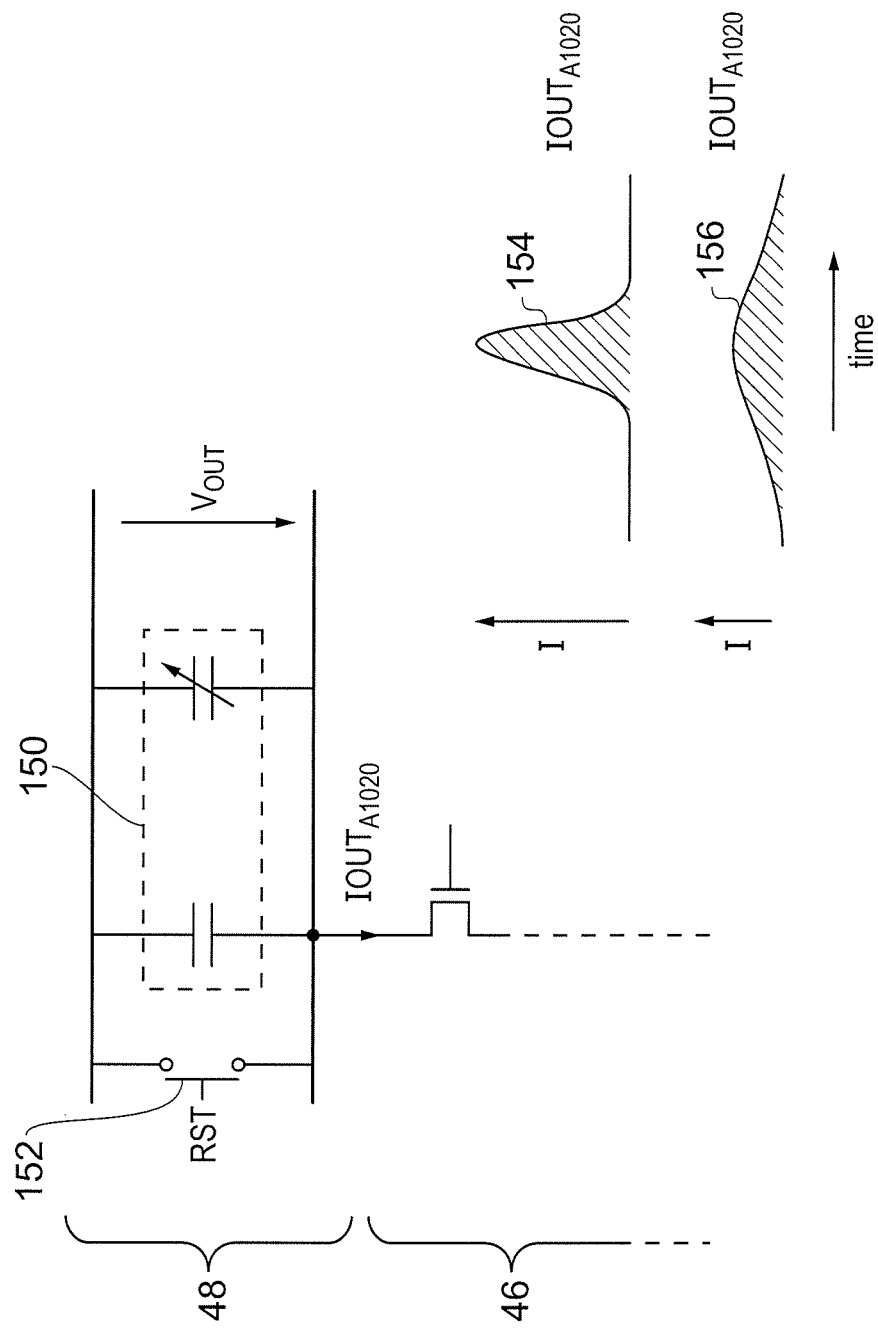

A first technique is to use the Conversion Complete (CC) signals (issued when a particular sub-conversion operation such as the final sub-conversion operation is complete) from all of the sub-ADC units of the FIG. 1 circuitry to control $V_{DD}$ (and/or bulk bias to adjust $V_{TH}$) to reduce power consumption. This would provide ASV (Adaptive Supply Voltage) functionality here for analogue circuitry.

The $V_{DD}$ to be controlled could be the system $V_{DD}$ on chip, which would affect the sampling circuitry 42 as well as the demultiplexers 46 and ADC units 48. However, it is preferable to control $V_{DD}$ for just the array of ADC units 48 since this is where the speed is needed and where most of the power is dissipated. Additionally, it may be undesirable to vary the overall system $V_{DD}$ to affect the sampling time of sampling circuitry 42 since this could add noise or distortion into the overall ADC 40 output.

The ADC units will operate faster with higher supply voltage ($V_{DD}$) and conversely slower with lower supply voltage. The general idea here is to examine the CC signals from all (or some) of the ADC units, and reduce $V_{DD}$ until one or more of them start to show an absence of CC signal, indicating them not completing their N-bit conversion in the time available. For example, the CC signals from all (or some) of the ADC units could be supplied to a controller via a latch (to collect signals which are otherwise time-interleaved) and a NAND gate, so that the controller receives a signal if any of the CC signals are missing.

In the present circuitry in line with FIG. 1, the time available (time window) for the overall conversions (made up of the sub-conversion operations) is set by the system clock signal, e.g. as is clear for FIG. 9A, and is thus the same for such asynchronous ADC units operated as in FIGS. 9B and 9C.

Thus, if a particular ADC unit generally finishes its conversions and issues its CC signals early, that unit may be considered a "fast" unit and there is potential to reduce its $V_{DD}$ to save power (and slow down its operation until it uses more of its available time windows).

Conversely, if a particular ADC unit is a "slow" unit, it would (in the absence of the fixed time windows) generally finish its conversions late, and issue its CC signals late. Given the fixed time windows, such a "slow" ADC unit would generally either finish its conversions and issue its CC signals very close to the end of the time windows, or not finish its conversions and hence not get to issue its CC signals (in which case not all of the sub-conversion operations would have completed and its output digital values would consequently have errors in the LSB or—in a worse case—more than one of the LSBs). That is, the time windows may be configured to run one after the next, back-to-back, so that even if a "slow" ADC unit has not finished its sub-conversion operations by the end of a particular window, that ADC unit is nevertheless reset and configured for the next conversion. For such a "slow" unit there is potential to increase its $V_{DD}$ and speed up its operation until it generally finishes its conversions and issues its CC signals within the available time windows.

Thus, $V_{DD}$ could be raised to reduce the number of ADC units which have absent CC signals or lowered to increase that number. Occasional LSB errors may have little or no effect on SNR of the overall ADC 40, such that occasional absent CC signals may be tolerated in order to achieve (by reducing $V_{DD}$) power-consumption savings. As apparent from the description above, $V_{DD}$ could be controlled/adjusted on a per ADC unit basis, or for groups (e.g. banks) of ADC units in common (including, of course, sub-groups of the array or the entire array). Also, bulk voltages of transistors (field-effect transistors) in the ADC units may be controlled/adjusted (with or without $V_{DD}$ control) on a per ADC unit basis, or for groups of ADC units in common (including, of course, sub-groups of the array or the entire array). Bulk voltage adjustment controls the threshold voltage $V_{TH}$ of the corresponding transistors, and thus their speed of operation.

Considering that ADC circuitry 40 employing the present techniques may be implemented as integrated circuitry on IC chips, such techniques enable $V_{DD}$ to be variable per chip, and for example to take account of process and/or temperature variations. The CC monitoring and $V_{DD}$ up/down adjustment can also be done during operation of the ADC circuitry 40 without interruption, for example to compensate for temperature changes or aging.

A second technique is to reduce ADC resolution by stopping the conversion process early. For example, an 8 b ADC could be run at 7 b or 6 b resolution, which would only give a small SNR decrease. However, in this way even fewer sub-conversion operations would be needed to completion (i.e. the CC signals could be issued in respect of earlier sub-conversion operations than the final one), allowing even lower $V_{DD}$ to be used.

For example, see FIG. 10 which indicates how reducing the resolution (8 b to 6 b) increases the amount of time available per sub-conversion operation (250 picoseconds to 333 picoseconds). As a result, the supply voltage $V_{DD}$ may be reduced (0.8 volts to 0.7 volts) given that the circuitry may operate slower and still carry out the number of conversions required in the time available. It is indicated that the power consumption—indicated simply by values P which may be compared relative to one another—may accordingly be reduced considerably (5.12 to 2.94). Again this enables per-chip, per-application (i.e. per customer) control.

Incidentally, it is noted in FIG. 9B (with reference to FIG. 9A) that it is the sub-conversion operations 1 to 8 (i.e. the actual successive-approximation operations) which are run asynchronously. That is, the Reset and Sample operations are run synchronously, and the present disclosure may be understood accordingly. In other words, the sub-conversion operations which may be made faster or slower with control (of e.g. $V_{DD}$ and/or bulk voltage) are the actual successive-approximation operations. Thus, for example in FIG. 10, the average duration is of the successive-approximation sub-conversion operations, assuming that there is available time for those operations in combination of 2 ns.

The following refinements have also been considered.

It is possible that not all of the ADC units be configured to issue CC signals, or for example for a controller to control which subset of the ADC units are configured to issue CC signals at any one time. Moreover, it is possible that a controller may use/consider (factor in, analyse, take into account) only a subset of the CC signals it is provided with, or for example that it compare one subset to another. This may enable identification of and focus on "trouble areas". The subset of the ADC units could be one sub-ADC unit, e.g. the "worst one"—this perhaps could be detected on start-up or during run time.

It is also possible to control VDD/bulk voltage on a per ADC unit basis, or per subset of the ADC units, or for all ADC units. Further, the control may be carried out continuously, or from time to time, e.g. during control periods.

It is also possible to configure the ADC units or the array thereof such the number of sub-conversion operations until the CC signal is issued is configurable or programmable (e.g. via a controller). For example, the number of sub-conversion operations until CC may be 6, 7, or 8, combining control of ADC resolution and power consumption.

Similarly, it may be possible to add a "dummy" sub-conversion operation at the end of the conversions. For example, if carrying out 8 b conversion, $V_{DD}$ could be adjusted to allow 9 b conversion with only occasional error on the LSB. This would effectively give one cycle of margin leading to error-free 8 b conversion which may be critical in some applications. Of course, there would be a power-consumption cost involved.

A further possibility in theory is to stop conversions after a "long" sub-conversion operation—this assumes that a long sub-conversion occurs when the decision state is extremely close to the final intended output value. This however has the drawback that it is very difficult in practice to detect a "long" sub-conversion operation—they are not much longer than other sub-conversion operations and are also typically very rare (e.g. 1 in 100, 1000, or even 10000).

Incidentally, although the above discussion has focussed on the CC signals, this is just one convenient way for the ADC units to indicate their performance, for example to a controller. Another possibility would be to analyse the digital output values of some or all of the ADC units, individually or in groups depending e.g. on how the ADC units are to be controlled. Such analysis could for example determine an SNR (Signal-to-Noise Ratio) value or similar. For example, if the SNR value were found to be too low, the VDD could be increased to try to raise that value, and vice versa. Similar considerations of course apply to bulk-voltage variation.

Figure 11:
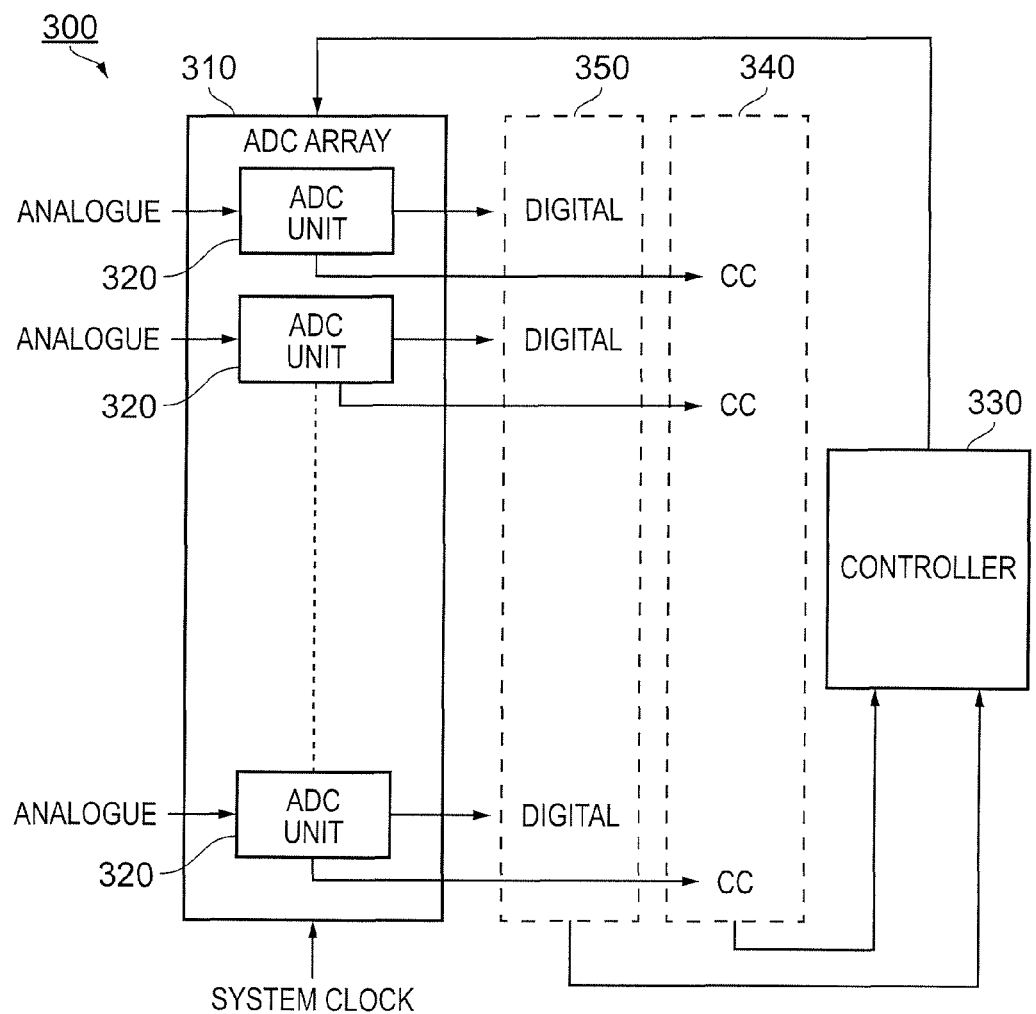
FIG. 11 is a schematic diagram of mixed-signal circuitry embodying the present invention.

FIG. 11 is a schematic diagram of mixed-signal circuitry 300 embodying the present invention. Mixed-signal circuitry 300 comprises an array 310 of ADC units 320 and a controller 330.

The ADC units 320 are configured to operate in a time-interleaved manner, and each operable in each of a series of time windows to convert an analogue input value into a corresponding digital output value, each conversion comprising a sequence of sub-conversion operations in line with FIG. 9B, each successive sub-conversion operation being triggered by completion of the preceding sub-conversion operation.

At least one of the ADC units 320 is operable to act as a reporting ADC unit and indicate, for each of one or more monitored said conversions, whether or not a particular one of the sub-conversion processes completed during the time window concerned.

The reporting ADC units 320 are operable to output CC signals per conversion, where they finish their conversions (or at least, the particular sub-conversion operation which triggers the CC signal) within the corresponding time windows.

The indications may comprise some or all of the CC signals 340 or the digital values 350. The controller is operable to consider or use at least one such indication and to control the circuitry in dependence upon the or each considered indication.

In FIG. 11, for convenience of description, all of the ADC units 320 are configured to act as such reporting ADC units, during operation of the circuitry 300. Further, again for convenience of description, it is assumed that the controller 330 is configured to consider all received indications, although it may be configured to consider only a subset of them. Controller 330 may, in some embodiments, be configured to determine which indications to consider, e.g. on a dynamic basis, for example as it identifies "problem" subsets of the ADC units 320.

Moreover, the controller 330 may, in some embodiments, be configured to control which of the ADC units 320 is a reporting ADC unit, and when (i.e. dynamically) such ADC units 320 are reporting units. Further, controller 330 may be configured to control when it controls operation of the ADC units 320, for example performing that control only during control periods.

Additionally, the controller 330 may, in some embodiments, be configured to control which sub-conversion operations of the ADC units 320 trigger issuance of the CC signals, and how many sub-conversion operations the ADC units 320 should perform per conversion. Controller 330 may also be configured to control which sub-conversion operations of the ADC units contribute to the output digital values.

As indicated in FIG. 11, such control of the ADC array 310 and the ADC units 320 is effected by an output signal of the controller 330 which is input to the ADC array 310. This control may be effected on a per ADC unit 320 basis, or per subset or group of the ADC units 320. Of course, the control may also be common to the full array 310.

Figure 12:
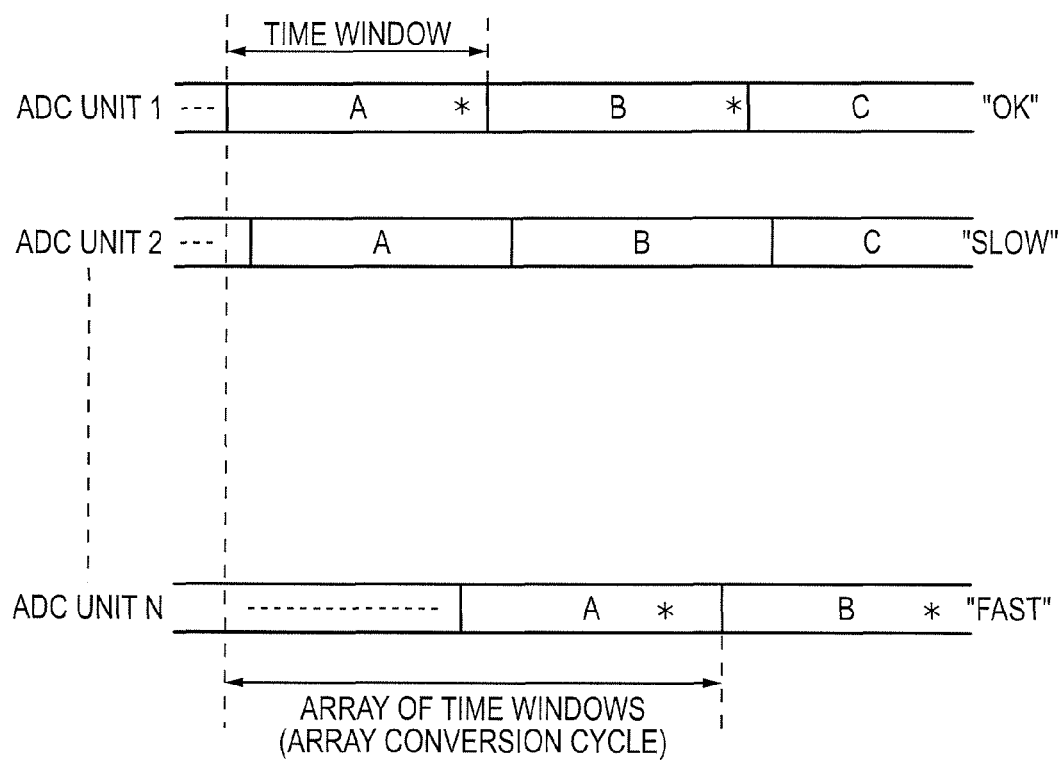
FIG. 12 is a schematic diagram useful for understanding the time-interleaved operation of the array of ADC units of FIG. 11.

FIG. 12 is a schematic diagram useful for understanding the time-interleaved operation of the array of ADC units 320, assuming that the array has N such units. The value N may for example be 8, 16, 32, 64, 128, 256, 320, 512 or 640, or indeed any value between or greater than those values.

A timeline is provided for each ADC unit 320, although only explicitly shown for the first two (labelled ADC UNIT 1 and ADC UNIT 2) and the last one (labelled ADC UNIT N). Moreover, for the first ADC unit 320 (ADC UNIT 1) three successive time windows are labelled A to C, and the corresponding time windows are similarly labelled for the other ADC units to the extent that they appear on the timelines.

Thus, the time windows A for the array are time-interleaved, with the time window A for ADC UNIT 1 starting first, and the corresponding time windows A for the further ADC units 320 of the array being staggered in time one from the next in order up to ADC UNIT N. In the present example, the time-interleaving is even, such that there is the same delay between corresponding time windows from one ADC unit 320 to the next in order across the array. For example, just after the time window A for the last ADC unit 320 of the array (ADC UNIT N) starts, the next time window B for ADC UNIT 1 starts.

With this in mind, the time taken for an array of corresponding time windows A is indicated in FIG. 12, and this may be considered an array conversion cycle (i.e. comprising a conversion per ADC unit 320 for the complete array 310). The controller 330 may for example consider indications such as CC signals on a per array conversion cycle basis.

Also indicated in FIG. 12 by way of star symbols in the time windows are examples of when CC signals might be issued, for the ADC units 320, e.g. assuming that they are all configured to operate in the same way as in FIG. 11. For ADC UNIT N the CC signals are generally issued relatively early in the time windows, and as such that ADC unit 320 may be considered a "fast" ADC unit. Conversely, ADC UNIT 2 generally doesn't issue CC signals, and as such that ADC unit 320 may be considered a "slow" ADC unit. ADC UNIT 1 generally issues CC signals for each time window, very close to the end of those time windows, and as such that ADC unit 320 may be considered an "OK" (or even "optimised") ADC unit. Such differences in speeds of the ADC units may be attributable to differences within and across process for the transistors of those ADC units, such as threshold-voltage ($V_{TH}$) variation.

One possibility is to increase $V_{DD}$ (or adjust bulk voltages) for the whole array 310 until even ADC UNIT 2 operates as shown for ADC UNIT 1. Although this may be advantageous in terms of how array 310 is controlled (i.e. common $V_{DD}$ and/or bulk voltage), it may be less advantageous in terms of power consumption as, for example, $V_{DD}$ may need to be turned up for the whole array causing several of the ADC units 320 to operate "fast".

Another possibility is to adjust $V_{DD}$ (or adjust bulk voltages) per ADC unit 320, until they all operate as shown for ADC UNIT 1. Yet another possibility is to adjust $V_{DD}$ (or adjust bulk voltages) per ADC unit 320, but only for the "slow" ADC units until they operate as shown for ADC UNIT 1. When also considering ADC resolution variation, it will be appreciated that many other control methods would be possible in line with the techniques described above. Of course, such control may also be applied per sub-group of the ADC units 320 as discussed earlier.

Figure 13:
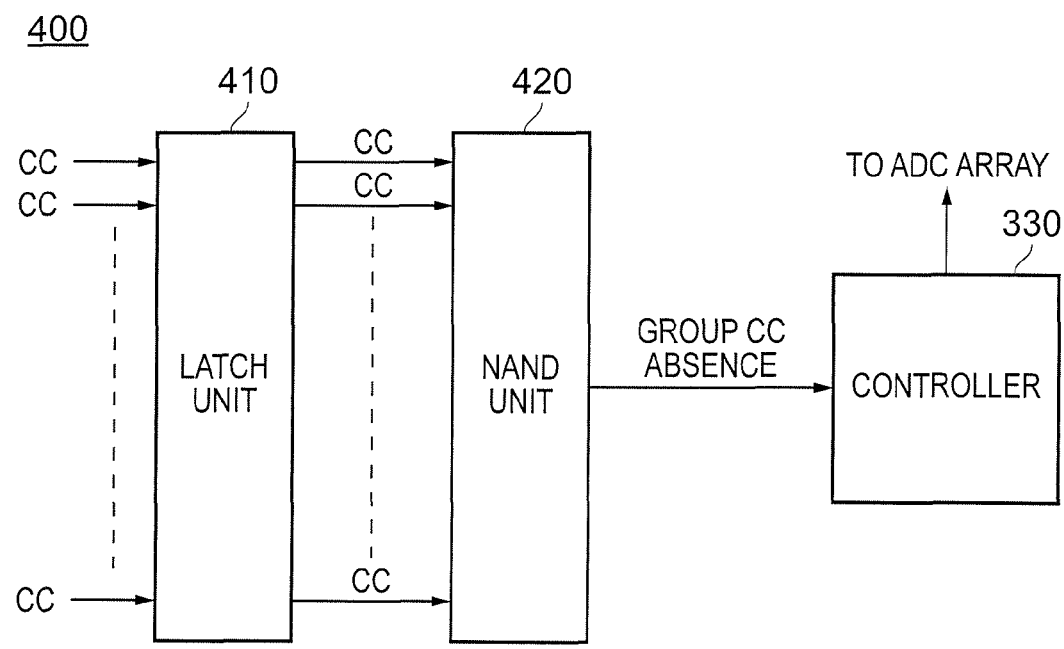
FIG. 13 is a schematic diagram of circuitry which may form part of the mixed-signal circuitry of FIG. 11.

FIG. 13 is a schematic diagram of circuitry 400 which may form part of mixed-signal circuitry 300. As well as controller 330, circuitry 400 comprises a latch unit 410 and a NAND unit 420.

As indicated in FIG. 13, one possibility is that the CC signals from some (e.g. a group) or all of the ADC units 320 be input to latch unit 410, so as to collect together and synchronise the CC signals which would otherwise be issued in a time-interleaved manner. The synchronised CC signals are then input to NAND unit 420 so that it outputs a signal only when one or more of the ADC units 320 concerned does not issue its signal in the time window (of an array conversion cycle) concerned. This signal is labelled in FIG. 13 as a "Group CC Absence" signal, and is input to the controller.

The controller may thus be configured to control (adjust) $V_{DD}$ and/or bulk voltage for the group of ADC units 320 concerned (via its signal to the array 310), which group might be the whole array, to tend to cause the "Group CC Absence" signal not to be issued, i.e. to tend to cause all the ADC units 320 concerned to complete their conversions in their time windows. Such control might be based, for example, on how often (frequency) the "Group CC Absence" signal is received. Of course, even if the group of ADC units 320 is a subset of the array 310, the control of $V_{DD}$ and/or bulk voltage might nevertheless be applied to more or all of the ADC units 320 (that group simply acting as an indicator of wider performance).

Naturally, such control may also be performed to tend to cause the number of ADC units 320 which complete or do not complete their conversions in their time windows to fall or stay within an acceptable range, e.g. between two threshold values. As mentioned above, it may be possible to tolerate a given (low) level of LSB errors and the like.

Additionally, the logical function regarding CC signals may be to check that all conversions have completed, requiring an AND unit (rather than NAND unit 420) if conversion complete (CC) goes high on completion. The exact implementation will of course depend on the signs of the various signals and the configuration of the controller, and may thus differ from embodiment to embodiment.

Figure 14:
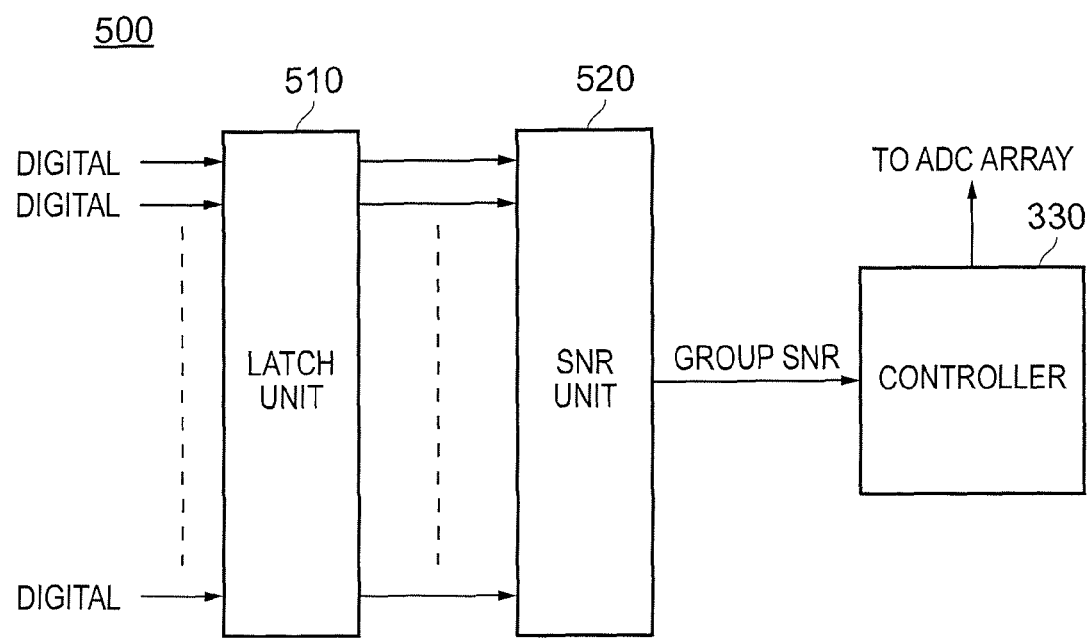
FIG. 14 is a schematic diagram of further circuitry which may form part of the mixed-signal circuitry of FIG. 11.

FIG. 14 is a schematic diagram of circuitry 500 which may form part of mixed-signal circuitry 300. As well as controller 330, circuitry 500 comprises a latch unit 510 and an SNR unit 520.

As indicated in FIG. 14, one possibility is that the DIGITAL signals from some (e.g. a group) or all of the ADC units 320 be input to latch unit 510, so as to collect together and synchronise the DIGITAL signals which might otherwise be issued in a time-interleaved manner. The synchronised DIGITAL signals are then input to SNR unit 520 so that it outputs a signal indicative of the SNR of those DIGITAL signals. This signal is labelled in FIG. 14 as a "Group SNR" signal, and is input to the controller.

The controller may thus be configured to control (adjust) $V_{DD}$ and/or bulk voltage for the group of ADC units 320 concerned (via its signal to the array 310), which group might be the whole array, to tend to cause the "Group SNR" to indicate a higher or lower SNR value (dependent on its current value), i.e. to tend to cause all of the ADC units 320 concerned to complete their conversions in their time windows (or the number of ADC units which complete or do not complete their conversions in their time windows to fall or stay within an acceptable range). Such control might be based, for example, on a series of such Group SNR signals, i.e. on a series of SNR values.

Of course, even if the group of ADC units 320 is a subset of the array 310, the control of $V_{DD}$ and/or bulk voltage might nevertheless be applied to more or all of the ADC units 320 (that group simply acting as an indicator of wider performance).

As will be apparent from the above, although the mixed-signal circuitry 300 comprises an array of ADC units 320, it is possible to control a single such ADC unit 320 based on indications received from that ADC unit 320 alone (acting as a reporting ADC unit).

That is, ADC units 320 may be controlled fully individually, as well as in groups. The above disclosure will be understood accordingly.

Circuitry of the present invention may from part of an analogue-to-digital converter. Circuitry of the present invention may be implemented as integrated circuitry, for example on an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many other different forms, within the scope of the appended claims.

The present disclosure extends to the following statements:

A1. Mixed-signal circuitry, comprising:
  an array of ADC units configured to operate in a time-interleaved manner, and each operable in each of a series of time windows to convert an analogue input value into a corresponding digital output value, each conversion comprising a sequence of sub-conversion operations, each successive sub-conversion operation of a sequence being triggered by completion of the preceding sub-conversion operation; and
  a controller,
  wherein:
  at least one of the ADC units is operable to act as a reporting ADC unit and indicate, for each of one or more monitored said conversions, whether or not a particular one of the sub-conversion operations completed during the time window concerned; and the controller is operable to consider at least one such indication and to control the circuitry in dependence upon the or each considered indication.

A2. Mixed-signal circuitry according to statement A1, wherein the time windows are all of the same length, optionally determined by a clock signal common to the array.

A3. Mixed-signal circuitry according to statement A1 or A2, wherein the time windows for the ADC units are synchronised with one another, and/or wherein the series of time windows for the respective ADC units are time-interleaved.

A4. Mixed-signal circuitry according to any of the preceding statements, wherein the ADC units of the array are organised into an order, and wherein the series of time windows for the respective ADC units are shifted in time one series to the next in said order in accordance with said time-interleaved operation.

A5. Mixed-signal circuitry according to any of the preceding statements, wherein some or all of said ADC units act as reporting ADC units.

A6. Mixed-signal circuitry according to any of the preceding statements, wherein the controller is operable to configure which ADC units act as reporting ADC units, optionally on a dynamic basis.

A7. Mixed-signal circuitry according to any of the preceding statements, wherein some or all of said conversions are monitored conversions.

A8. Mixed-signal circuitry according to any of the preceding statements, wherein the controller is operable to configure which conversions are monitored conversions, optionally on a dynamic basis.

A9. Mixed-signal circuitry according to any of the preceding statements, wherein some or all of the indications are considered indications.

A10. Mixed-signal circuitry according to any of the preceding statements, wherein the controller is operable to configure which indications are considered indications, optionally on a dynamic basis.

A11. Mixed-signal circuitry according to any of the preceding statements, wherein the controller is operable to consider a set of indications provided during a particular time period, and to perform the control based on the set of considered indications.

A12. Mixed-signal circuitry according to statement A11, wherein the particular time period comprises an array of time-interleaved said time windows, the array of time-interleaved time windows comprising a given number of time windows per ADC unit of the array of ADC units.

A13. Mixed-signal circuitry according to any of the preceding statements, wherein the controller is operable to consider a set of indications provided by a group of the ADC units, and to perform the control based on the set of considered indications.

A14. Mixed-signal circuitry according to any of the preceding statements, wherein the controller is operable to carry out the consideration and control at least or only during control periods.

A15. Mixed-signal circuitry according to statement A14, wherein the controller is operable to configure when the control periods occur.

A16. Mixed-signal circuitry according to any of the preceding statements, wherein the controller is operable to configure which sub-conversion operation per sequence of sub-conversion operations is the particular one.

A17. Mixed-signal circuitry according to any of the preceding statements, wherein the final or penultimate sub-conversion operation per sequence is the particular one.

A18. Mixed-signal circuitry according to any of the preceding statements, wherein the controller is operable to configure how many sub-conversion operations there are in the sequences.

A19. Mixed-signal circuitry according to any of the preceding statements, wherein the reporting ADC units are operable to perform such indication by outputting a conversion-complete signal when the particular one of the sub-conversion operations of a monitored conversion completes during the time window concerned.

A20. Mixed-signal circuitry according to any of the preceding statements, wherein the reporting ADC units are operable to perform such indication by outputting said digital output values, the controller being operable to control the circuitry based on analysing such digital output values.

A21. Mixed-signal circuitry according to any of the preceding statements, wherein the controller is operable to control the circuitry by controlling the magnitude of a supply voltage provided individually to one or more ADC units of the array, and/or in common to some or all of the ADC units of the array.

A22. Mixed-signal circuitry according to statement A21, wherein said controlling comprises increasing, decreasing or maintaining the supply voltage concerned.

A23. Mixed-signal circuitry according to any of the preceding statements, wherein the controller is operable to control the circuitry by controlling the magnitude of a bulk voltage supplied to field-effect transistors of one or more ADC units of the array.

A24. Mixed-signal circuitry according to statement A23, wherein said controlling comprises increasing, decreasing or maintaining the bulk voltage.

A25. Mixed-signal circuitry according to any of the preceding statements, wherein the controller is operable to control the circuitry based on the considered indications to tend to cause future such indications to indicate that a target performance has been achieved.

A26. Mixed-signal circuitry according to statement A25, wherein the target performance comprises a target amount of power consumed by one or more ADC units of the array.

A27. Mixed-signal circuitry according to statement A25 or 26, wherein the target performance comprises a target proportion of the considered indications which indicate that the particular sub-conversion operation completed in the time window concerned.

A28. Mixed-signal circuitry according to any of the preceding statements, wherein the controller is operable to perform said control in respect of the ADC units from which the considered indications were provided.

A29. Mixed-signal circuitry according to any of the preceding statements, wherein the controller is operable to configure whether the final sub-conversion operations per sequence contribute to the respective digital output values.

A30. Mixed-signal circuitry according to any of the preceding statements, wherein some or all of the sub-conversion operations in a sequence generate a corresponding bit value of the digital output value concerned.

A31. Mixed-signal circuitry according to any of the preceding statements, wherein the sub-conversion operations are successive-approximation operations.

A32. Mixed-signal circuitry according to any of the preceding statements, wherein the or each said ADC unit is an asynchronous ADC unit.

A33. Mixed-signal circuitry according to any of the preceding statements, wherein the array of ADC units comprises at least 8, 16, 32, 64 or 128 ADC units.

A34. An analogue-to-digital converter comprising mixed-signal circuitry according to any of the preceding statements.

A35. An integrated circuit or an IC chip comprising mixed-signal circuitry according to any of statements A1 to A33, or an analogue-to-digital converter according to statement A34.

The invention claimed is:

1. Mixed-signal circuitry, comprising:
   an array of ADC units configured to operate in a time-interleaved manner, and each operable in each of a series of time windows to convert an analogue input value into a corresponding digital output value, each conversion comprising a sequence of sub-conversion operations, each successive sub-conversion operation of a sequence being triggered by completion of the preceding sub-conversion operation; and
   a controller,
   wherein:
   at least one of the ADC units is operable to act as a reporting ADC unit and indicate, for each of one or more monitored said conversions, whether or not a particular one of the sub-conversion operations completed during the time window concerned; and
   the controller is operable to consider at least one such indication and to control the circuitry in dependence upon the or each considered indication.

2. Mixed-signal circuitry as claimed in claim 1, wherein the time windows for the ADC units are synchronised with one another, and/or wherein the series of time windows for the respective ADC units are time-interleaved.

3. Mixed-signal circuitry as claimed in claim 1, wherein:
   some or all of said ADC units act as reporting ADC units; and/or
   some or all of said conversions are monitored conversions; and/or
   some or all of the indications are considered indications.

4. Mixed-signal circuitry as claimed in claim 1, wherein the controller is operable to configure, optionally on a dynamic basis:
   which ADC units act as reporting ADC units; and/or
   which conversions are monitored conversions; and/or
   which indications are considered indications.

5. Mixed-signal circuitry as claimed in claim 1, wherein:
   the controller is operable to configure which sub-conversion operation per sequence of sub-conversion operations is the particular one; and/or
   the final or penultimate sub-conversion operation per sequence is the particular one.

6. Mixed-signal circuitry as claimed in claim 1, wherein the controller is operable to configure how many sub-conversion operations there are in the sequences.

7. Mixed-signal circuitry as claimed in claim 1, wherein the reporting ADC units are operable to perform such indication by outputting a conversion-complete signal when the particular one of the sub-conversion operations of a monitored conversion completes during the time window concerned.

8. Mixed-signal circuitry as claimed in claim 1, wherein the reporting ADC units are operable to perform such indication by outputting said digital output values, the controller being operable to control the circuitry based on analysing such digital output values.

9. Mixed-signal circuitry as claimed in claim 1, wherein the controller is operable to control the circuitry by controlling the magnitude of a supply voltage provided individually to one or more ADC units of the array, and/or in common to some or all of the ADC units of the array.

10. Mixed-signal circuitry as claimed in claim 1, wherein the controller is operable to control the circuitry by controlling the magnitude of a bulk voltage supplied to field-effect transistors of one or more ADC units of the array.

11. Mixed-signal circuitry as claimed in claim 1, wherein the controller is operable to control the circuitry based on the considered indications to tend to cause future such indications to indicate that a target performance has been achieved.

12. Mixed-signal circuitry as claimed in claim 11, wherein the target performance comprises:
    a target amount of power consumed by one or more ADC units of the array; and/or
    a target proportion of the considered indications which indicate that the particular sub-conversion operation completed in the time window concerned; and/or
    a target speed of conversion.

13. Mixed-signal circuitry as claimed in claim 1, wherein the controller is operable to configure whether the final sub-conversion operation per sequence contributes to the corresponding digital output value.

14. Mixed-signal circuitry as claimed in claim 1, wherein the sub-conversion operations are successive-approximation operations and/or the ADC units are asynchronous ADC units.

15. An analogue-to-digital converter comprising mixed-signal circuitry as claimed in claim 1.

* * * * *